United States Patent
Hanzawa

(10) Patent No.: US 10,154,219 B2
(45) Date of Patent: Dec. 11, 2018

(54) SIGNAL PROCESSING DEVICE, IMAGE PICKUP ELEMENT, AND ELECTRONIC DEVICE

(71) Applicant: SONY CORPORATION, Tokyo (JP)

(72) Inventor: Katsuhiko Hanzawa, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 15/503,119

(22) PCT Filed: Aug. 11, 2015

(86) PCT No.: PCT/JP2015/072722
§ 371 (c)(1),
(2) Date: Feb. 10, 2017

(87) PCT Pub. No.: WO2016/027729
PCT Pub. Date: Feb. 25, 2016

(65) Prior Publication Data
US 2017/0237924 A1    Aug. 17, 2017

(30) Foreign Application Priority Data
Aug. 20, 2014    (JP) .................................. 2014-167498

(51) Int. Cl.
*H04N 5/378*    (2011.01)
*H04N 5/357*    (2011.01)
(Continued)

(52) U.S. Cl.
CPC .......... *H04N 5/378* (2013.01); *H03M 1/0845* (2013.01); *H03M 1/12* (2013.01);
(Continued)

(58) Field of Classification Search
CPC .............................. H04N 5/378; H03M 1/12
See application file for complete search history.

(56) References Cited

U.S. PATENT DOCUMENTS

| 6,243,034 B1* | 6/2001 | Regier | .................. | H03M 1/145 |
| | | | | 341/155 |
| 2009/0026352 A1* | 1/2009 | Shimomura | ......... | H04N 5/3742 |
| | | | | 250/214 R |

FOREIGN PATENT DOCUMENTS

| JP | 2009-049459 | 3/2009 |
| JP | 2009-206709 | 9/2009 |

(Continued)

OTHER PUBLICATIONS

International Search Report prepared by the Japan Patent Office dated Sep. 11, 2015, for International Application No. PCT/JP2015/072722.

*Primary Examiner* — Ahmed A Berhan
(74) *Attorney, Agent, or Firm* — Sheridan Ross P.C.

(57) ABSTRACT

The present technology relates to a signal processing device, an image pickup element, and an electronic device capable of suppressing power source variation due to driving of a counter. The signal processing device according to the present technology includes a first A/D converter which performs A/D conversion on an analog signal by using a first counter being a predetermined counter and a second A/D converter which performs the A/D conversion on the analog signal by using a second counter count timing of which is the same as that of the first counter and a polarity of a count value of which is opposite to that of the first counter. The first and second A/D converters are arranged in the vicinity of each other such that power source variations thereof affect both. The present technology may be applied to the image pickup element and the electronic device, for example.

20 Claims, 27 Drawing Sheets

(51) Int. Cl.
*H03M 1/08* (2006.01)
*H03M 1/12* (2006.01)
*H04N 5/374* (2011.01)
*H03M 1/56* (2006.01)
*H04N 5/3745* (2011.01)

(52) U.S. Cl.
CPC ........... *H04N 5/3577* (2013.01); *H04N 5/374* (2013.01); *H04N 5/37455* (2013.01); *H03M 1/123* (2013.01); *H03M 1/56* (2013.01)

(56) References Cited

FOREIGN PATENT DOCUMENTS

| | | |
|---|---|---|
| JP | 2010-232747 A | 10/2010 |
| JP | 2011-259016 A | 12/2011 |
| JP | 2013-251824 A | 12/2013 |
| WO | WO 2013/122221 A1 | 8/2013 |

\* cited by examiner

FIG. 6
BIT1 
BIT2 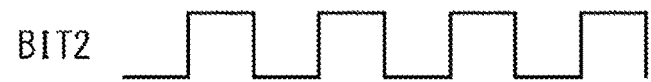
BIT3 
BIT4 
A
BIT1 
BIT2 
BIT3 
BIT4 
B

FIG. 17
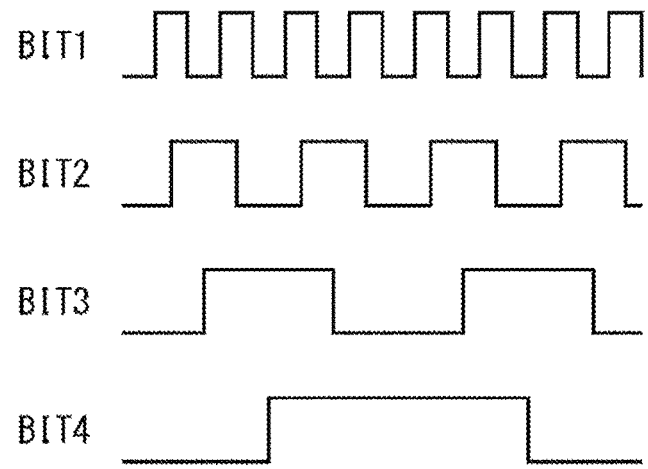
A
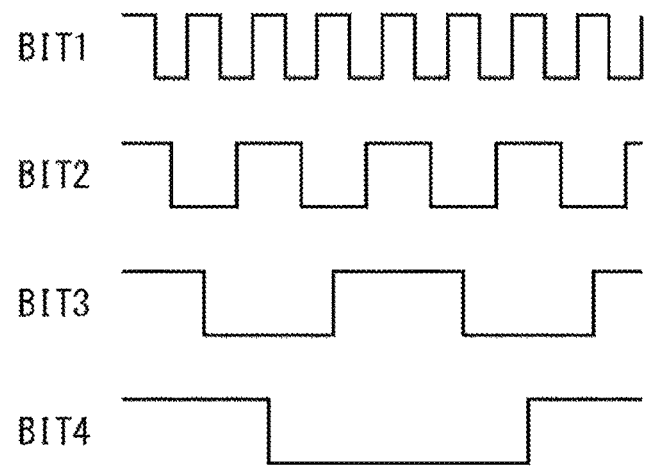
B

SIGNAL PROCESSING DEVICE, IMAGE PICKUP ELEMENT, AND ELECTRONIC DEVICE

CROSS REFERENCE TO RELATED APPLICATIONS

This application is a national stage application under 35 U.S.C. 371 and claims the benefit of PCT Application No. PCT/JP2015/072722 having an international filing date of 11 Aug. 2015, which designated the United States, which PCT application claimed the benefit of Japanese Patent Application No. 2014-167498 filed 20 Aug. 2014, the disclosures of which are incorporated herein by reference in their entirety.

TECHNICAL FIELD

The present technology relates to a signal processing device, an image pickup element, and an electronic device, and especially relates to the signal processing device, the image pickup element, and the electronic device capable of suppressing power source variation due to driving of a counter.

BACKGROUND ART

Conventionally, an A/D converter used in an image sensor and the like is generally configured to perform A/D conversion by a single slope A/D conversion system and the like and includes a counter circuit. In such counter circuit, current does not flow when a count value is not inverted, but the current flows when the count value is inverted, so that noise might be generated due to power source variation. Especially, simultaneous inversion of the count values (inversion of all bits) might cause large power source variation.

Therefore, a method of preventing such simultaneous inversion is considered. For example, a system of dividing operation timings of counters into former counts and latter counts is considered (for example, refer to Patent Documents 1 and 2). Also, operation in which positive and negative edges are used such that the A/D conversion may be performed with shifted count timings is considered (for example, refer to Patent Document 3).

CITATION LIST

Patent Document

Patent Document 1: Japanese Patent Application Laid-Open No. 2009-49459
Patent Document 2: Japanese Patent Application Laid-Open No. 2009-206709
Patent Document 3: Japanese Patent Application Laid-Open No. 2011-259016

SUMMARY OF THE INVENTION

Problems to be Solved by the Invention

However, the power source variation due to the driving of the counter also occurs even when the count values are not simultaneously inverted, so that there is a case in which the power source variation cannot be sufficiently suppressed by the methods.

The present technology is suggested in view of such circumstances and an object thereof is to suppress the power source variation due to the driving of the counter.

Solutions to Problems

An aspect of the present technology is a signal processing device provided with a first A/D converter which performs A/D conversion on an analog signal by using a first counter being a predetermined counter, and a second A/D converter which performs the A/D conversion on the analog signal by using a second counter count timing of which is the same as the count timing of the first counter and a polarity of a count value of which is opposite to the polarity of the count value of the first counter, wherein the first A/D converter and the second A/D converter are arranged in the vicinity of each other such that power source variations of the first and second A/D converters affect each other.

The first counter may be an up counter, and the second counter may be a down counter.

The first counter and the second counter may be non-synchronous counters.

The first counter and the second counter may be synchronous counters.

The first counter and the second counter may be formed of JK flip-flops.

The first counter and the second counter may be formed of D flip-flops.

The first counter may be obtained by driving an up/down counter as the up counter, and the second counter may be obtained by driving the up/down counter as the down counter.

The first counter and the second counter may be binary counters.

The first counter and the second counter may be gray code counters.

The first counter and the second counter may be counters which use a time to digital converter (TDC).

Each of the first A/D converter and the second A/D converter may perform the A/D conversion on the analog signal by a single slope A/D conversion system.

Each of the first A/D converter and the second A/D converter may perform the A/D conversion on the analog signal by an integral type A/D conversion system.

The first A/D converter and the second A/D converter may be alternately arranged in one row.

A plurality of first A/D converters and a plurality of second A/D converters may be alternately arranged in one row.

The first A/D converter and the second A/D converter may be alternately arranged in a row direction to form a matrix.

The first A/D converter and the second A/D converter may be alternately arranged in a row direction and in a column direction to form a matrix.

Each of the first A/D converter and the second A/D converter may perform the A/D conversion on a signal read from a unit pixel belonging to a unit pixel column assigned to each of the first A/D converter and the second A/D converter in a pixel area.

Each of the first A/D converter and the second A/D converter may perform the A/D conversion on a signal read from a unit pixel in a partial area assigned to each of the first A/D converter and the second A/D converter in a pixel area.

Another aspect of the present technology is an image pickup element provided with a pixel array in which a plurality of unit pixels is arranged to form a matrix, a first A/D converter which performs A/D conversion on an analog signal by using a first counter being a predetermined counter, and a second A/D converter which performs the A/D conversion on the analog signal by using a second counter count timing of which is the same as the count timing of the first counter and a polarity of a count value of which is opposite to the polarity of the count value of the first counter, wherein the first A/D converter and the second A/D converter are arranged in the vicinity of each other such that power source variations of the first and second A/D converters affect each other.

Still another aspect of the present technology is an electronic device provided with an imaging unit which captures an image of an object, and an image processor which performs image processing on image data obtained by imaging by the imaging unit, the imaging unit including a pixel array in which a plurality of unit pixels is arranged to form a matrix, a first A/D converter which performs A/D conversion on an analog signal by using a first counter being a predetermined counter, and a second A/D converter which performs the A/D conversion on the analog signal by using a second counter count timing of which is the same as the count timing of the first counter and a polarity of a count value of which is opposite to the polarity of the count value of the first counter, wherein the first A/D converter and the second A/D converter are arranged in the vicinity of each other such that power source variations of the first and second A/D converters affect each other.

In an aspect of the present technology, a first A/D converter which performs A/D conversion on an analog signal by using a first counter being a predetermined counter and a second A/D converter which performs the A/D conversion on the analog signal by using a second counter count timing of which is the same as the count timing of the first counter and a polarity of a count value of which is opposite to the polarity of the count value of the first counter are arranged in the vicinity of each other such that power source variations of the first and second A/D converters affect each other.

In another aspect of the present technology, in an image pickup element, a first A/D converter which performs A/D conversion on an analog signal read from a unit pixel arranged in a pixel array in which a plurality of unit pixels is arranged to form a matrix by using a first counter being a predetermined counter and a second A/D converter which performs the A/D conversion on the analog signal read from the unit pixel arranged in the pixel array by using a second counter count timing of which is the same as the count timing of the first counter and a polarity of a count value of which is opposite to the polarity of the count value of the first counter are arranged in the vicinity of each other such that power source variations thereof affect each other.

In still another aspect of the present technology, in an image pickup element provided with a pixel array in which a plurality of unit pixels is arranged to form a matrix of an electronic device, a first A/D converter which performs A/D conversion on an analog signal read from a unit pixel arranged in a pixel array by using a first counter being a predetermined counter and a second A/D converter which performs the A/D conversion on the analog signal read from the unit pixel arranged in the pixel array by using a second counter count timing of which is the same as the count timing of the first counter and a polarity of a count value of which is opposite to the polarity of the count value of the first counter are arranged in the vicinity of each other such that power source variations of the first and second A/D converters affect each other.

Effects of the Invention

According to the present technology, it is possible to process a signal. Also, according to the present technology, power source variation due to driving of a counter may be suppressed.

BRIEF DESCRIPTION OF DRAWINGS

FIG. 6 is a timing chart illustrating an example of a state of variation of a count value.

FIG. 17 is a timing chart illustrating another example of the counter.

MODE FOR CARRYING OUT THE INVENTION

Figure 1:
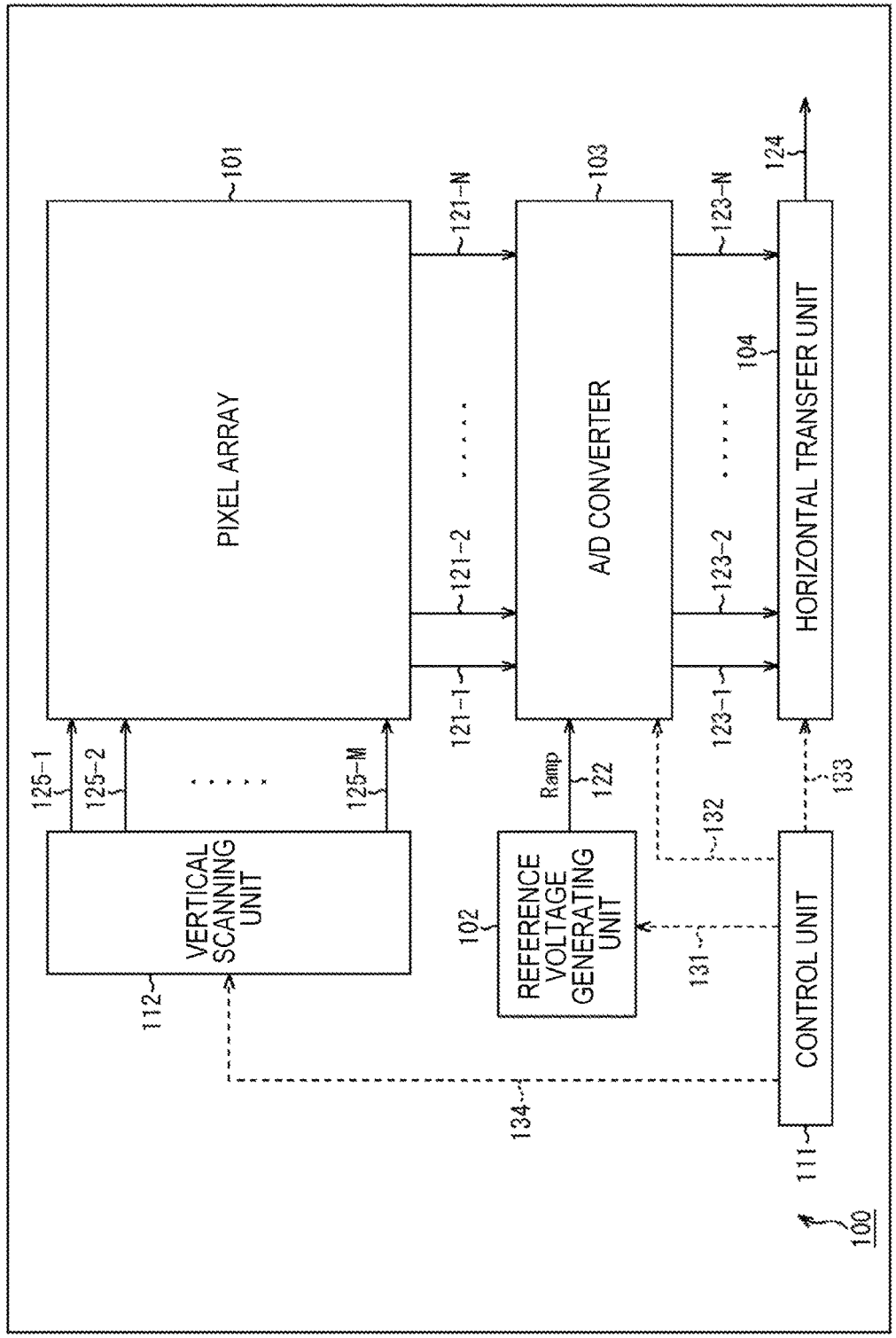
FIG. 1 is a view illustrating a principal configuration example of an image sensor.

Modes for carrying out the present disclosure (hereinafter, referred to as embodiments) are hereinafter described. Meanwhile, the description is given in the following order.
1. First Embodiment (Image Sensor/Column A/D Converter)
2. Second Embodiment (Image Sensor/Area A/D Converter)
3. Third Embodiment (Imaging Device)

1. First Embodiment

<Power Source Variation Due to Counter Driving>

An A/D converter used in an image sensor and the like is generally configured to perform A/D conversion by a single slope A/D conversion system and the like and includes a counter circuit. In such counter circuit, current does not flow when a count value is not inverted, but the current flows when the count value is inverted, so that noise might be generated due to power source variation. Especially, simultaneous inversion of the count values (inversion of all bits) might cause large power source variation.

Therefore, a method of preventing such simultaneous inversion is considered. For example, a system of dividing operation timings of counters into former counts and latter counts is disclosed in Patent Documents 1 and 2. Also, Patent Document 3 discloses operation in which positive and negative edges are used such that the A/D conversion may be performed with shifted count timings. However, in such methods, an A/D frequency is reduced to half as compared to a case of double data rate (DDR) driving.

The power source variation due to the driving of the counter also occurs even when the count values are not simultaneously inverted, so that there is a case in which the power source variation cannot be sufficiently suppressed by the methods.

For example, there is a method of providing the A/D converter (column A/D converter) for each column of unit pixels in a pixel area to perform the A/D conversion on signals of respective columns in parallel in the image sensor; in such a case, a large number of column A/D converters are arranged in the vicinity of one another in the image sensor and they are driven at the same time. Therefore, also in a case of one-bit inversion of the count value, the large current variation occurs because all the columns are inverted and a power source might significantly fluctuate.

Therefore, an operation margin of the counter should be secured in consideration of the power source variation and there is a case in which a decrease in power source voltage becomes difficult according to this. Also, since the large power source variation might occur, it is required to provide large decoupling capacitance for suppressing the power source variation.

<Parallel Usage of Counters with Different Polarities>

Therefore, a first A/D converter including one of two types of counters with the same count timing and opposite polarities of the count values and a second A/D converter including the other of them are arranged in vicinity of each other such that the power source variations thereof affect each other.

For example, a signal processing device is provided with the first A/D converter which performs the A/D conversion on an analog signal by using a first counter being a predetermined counter and the second A/D converter which performs the A/D conversion on the analog signal by using a second counter the count timing of which is the same as that of the first counter and the polarity of the count value of which is opposite to that of the first counter, and the first and second A/D converters are arranged in the vicinity of each other such that the power source variations thereof affect each other.

By configuring in this manner, the power source variation due to the driving of the counter of the first A/D converter and the power source variation due to the driving of the counter of the second A/D converter cancel each other, so that the power source variation due to the driving of the counter is suppressed as a whole. According to this, noise generation is suppressed. Therefore, deterioration in image quality of a captured image may be inhibited in a case of the image sensor, for example.

<Image Sensor>

A principal configuration example of the image sensor being one embodiment of an image pickup element to which such present technology is applied is illustrated in FIG. 1. An image sensor 100 illustrated in FIG. 1 is a device which performs photoelectric conversion on light from an object to output as image data. For example, the image sensor 100 is configured as a CMOS image sensor in which a complementary metal oxide semiconductor (CMOS) is used, a CCD image sensor in which a charge coupled device (CCD) is used and the like.

As illustrated in FIG. 1, the image sensor 100 includes a pixel array 101, a reference voltage generating unit 102, an A/D converter 103, a horizontal transfer unit 104, a control unit 111, and a vertical scanning unit 112.

The pixel array 101 is the pixel area in which pixel configurations (unit pixels) each having a photoelectric conversion element such as a photo diode are arranged to form a planer surface or a curved surface. Although a configuration of the pixel array 101 is described later in detail, the analog signal read from the unit pixel is transmitted to the A/D converter 103 through any one of vertical signal lines 121-1 to 121-N. When it is not hereinafter required to distinguish the vertical signal lines 121-1 to 121-N from one another to describe, they are referred to as the vertical signal lines 121.

The reference voltage generating unit 102 generates a reference signal (also referred to as reference voltage) serving as a criterion signal of the A/D conversion of the A/D converter 103. The reference signal has an arbitrary waveform. For example, the reference signal may be a ramp wave (sawtooth wave). Hereinafter, a case in which the ramp wave (ramp) is used as the reference signal is described as an example. The reference voltage generating unit 102 including a D/A converter, for example, generates the reference signal (ramp) by the D/A converter. The reference signal (ramp) is supplied to the A/D converter 103 through a reference signal line 122.

The A/D converter 103 performs the A/D conversion on the analog signal and the like (read from each unit pixel) transmitted from the pixel array 101 through the vertical signal line 121 by using the reference signal and outputs digital data to the horizontal transfer unit 104 through any one of signal lines 123-1 to 123-N. When it is not hereinafter required to distinguish the signal lines 123-1 to 123-N from one another to describe, they are referred to as the signal lines 123.

The horizontal transfer unit 104 transfers the digital data supplied from the A/D converter 103 through the signal line 123 outside the image sensor 100 through a signal line 124.

The control unit 111 controls the reference voltage generating unit 102 by supplying the same with a control signal through a control line 131. Also, the control unit 111 controls the A/D converter 103 by supplying the same with a control signal through a control line 132. Also, the control unit 111 controls the horizontal transfer unit 104 by supplying the same with a control signal through a control line 133. Also, the control unit 111 controls the vertical scanning unit 112 by supplying the same with a control signal through a control line 134. The control unit 111 controls operation of an entire image sensor 100 (operation of each unit) by controlling each unit of the image sensor 100 in this manner.

Meanwhile, in FIG. 1, each of the control lines 131 to 134 described above is indicated by one dotted line (dotted arrow); however, each of the control lines may also be formed of a plurality of control lines.

The vertical scanning unit 112 is controlled by the control unit 111 to supply a control signal through control lines 125-1 to 125-M, thereby controlling operation of a transistor of each unit pixel in the pixel array 101. Meanwhile, when it is not hereinafter required to distinguish the control lines 125-1 to 125-M from one another to describe, they are referred to as the control lines 125.

<Pixel Array>

Figure 2:
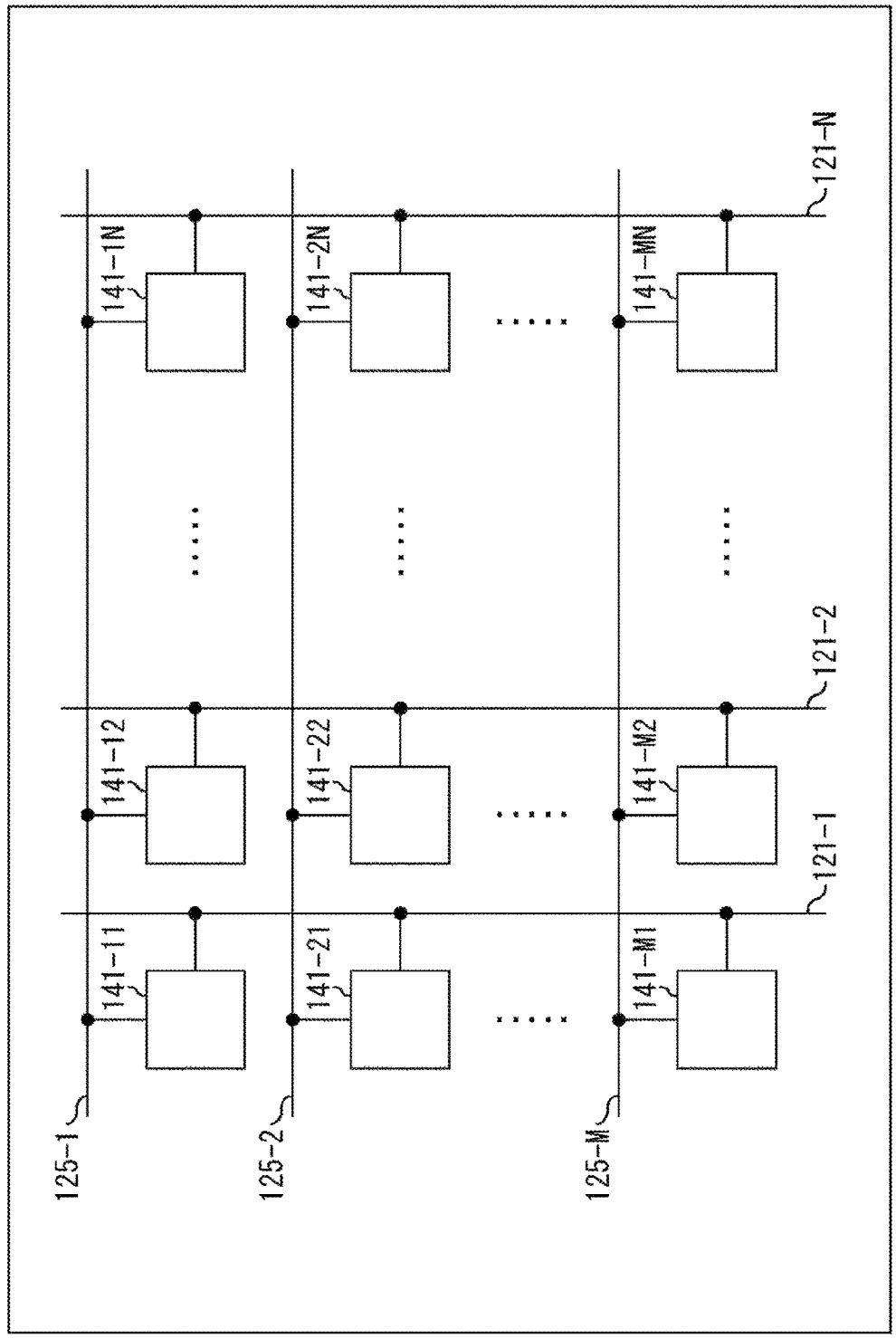
FIG. 2 is a view illustrating a principal configuration example of a pixel array.

A principal configuration example of the pixel array 101 is illustrated in FIG. 2. As described above, a plurality of unit pixels is arranged to form a surface in the pixel area (pixel array 101). In a case of the example in FIG. 2, M×N unit pixels 141 (unit pixels 141-11 to 141-MN) are arranged to form a matrix (array) including M rows and N columns (M and N are arbitrary natural numbers). When it is not hereinafter required to distinguish the unit pixels 141-11 to 141-MN from one another to describe, they are referred to as the unit pixels 141. A way of arranging the unit pixels 141 is arbitrary; they may be arranged to form a shape other than the matrix such as a so-called honey comb structure, for example.

As illustrated in FIG. 2, the vertical signal lines 121 (vertical signal lines 121-1 to 121-N) are formed for respective columns of the unit pixels 141 (hereinafter, also referred to as unit pixel columns). Then, each vertical signal line 121 connected to respective unit pixels of the column (unit pixel column) corresponding to the same transmits the signals read from the unit pixels to the A/D converter 103. Also, as illustrated in FIG. 2, the control lines 125 (control lines 125-1 to 125-M) are formed for respective rows of the unit pixels 141 (hereinafter, also referred to as unit pixel rows). Then, each control line 125 connected to respective unit pixels of the unit pixel row corresponding to the same transmits the control signal supplied from the vertical scanning unit 112 to the respective unit pixels.

That is to say, the unit pixel 141 is connected to the vertical signal line 121 assigned to the column (unit pixel column) to which the same belongs and the control line 125 assigned to the unit pixel row to which the same belongs, driven on the basis of the control signal supplied through the control line 125, and supplies an electric signal obtained by the same to the A/D converter 103 through the vertical signal line 121.

Meanwhile, although the control line 125 of each row is indicated as one line in FIG. 2, it is also possible that the control line 125 of each row is formed of a plurality of control lines.

<Unit Pixel Configuration>

Figure 3:
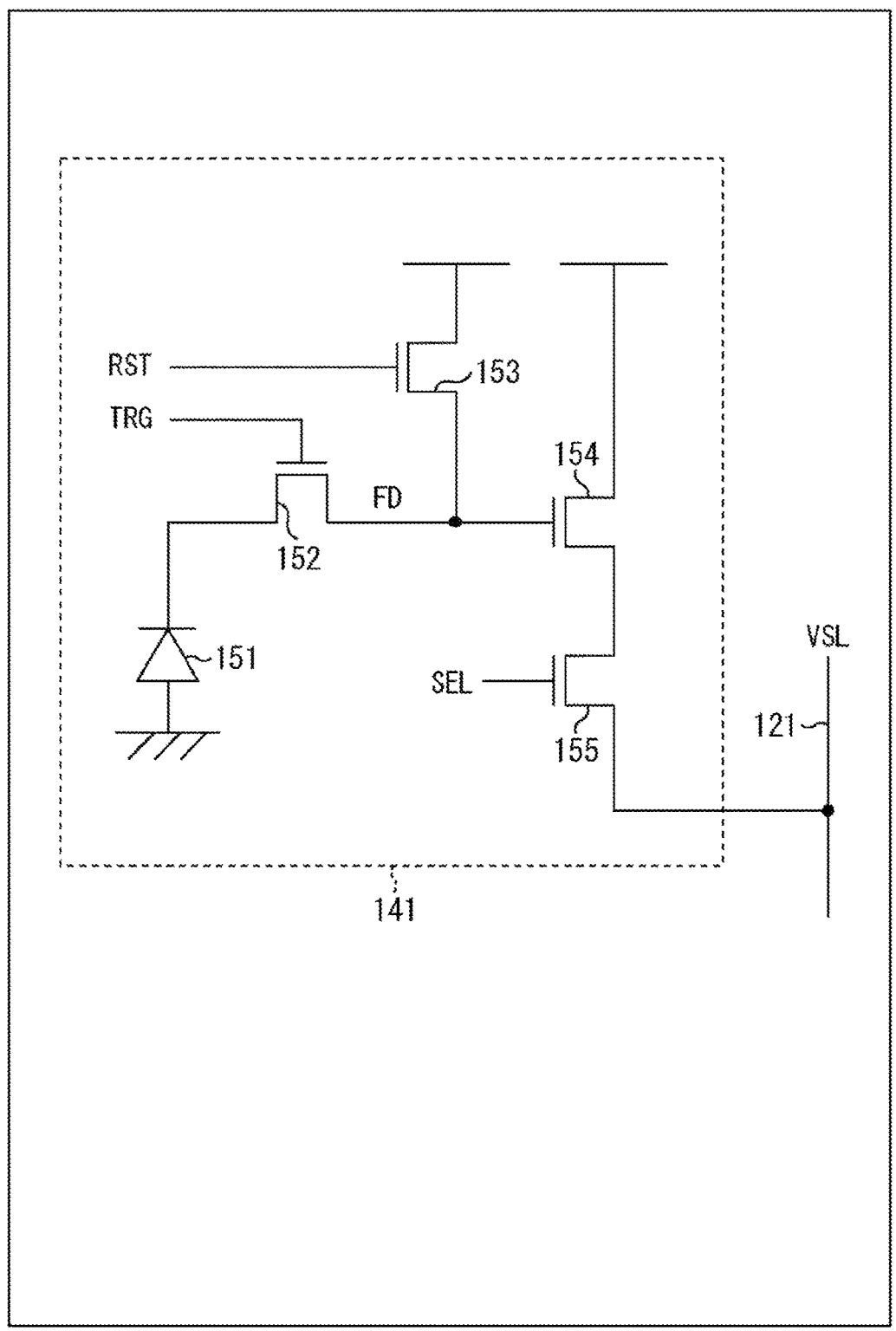
FIG. 3 is a view illustrating a principal configuration example of a unit pixel.

FIG. 3 is a view illustrating an example of a principal configuration of a circuit configuration of the unit pixel 141. As illustrated in FIG. 3, the unit pixel 141 includes a photo diode (PD) 151, a transfer transistor 152, a reset transistor 153, an amplification transistor 154, and a select transistor 155.

The photo diode (PD) 151 performs the photoelectric conversion of received light to obtain a photoelectric charge (herein, a photoelectron) having a charge amount according to a light amount thereof to accumulate the photoelectric charge. The accumulated photoelectric charge is read at predetermined timing. An anode electrode of the photo diode (PD) 151 is connected to ground of the pixel area (pixel ground) and a cathode electrode thereof is connected to floating diffusion (FD) through the transfer transistor 152. Of course, a system may be such that the cathode electrode of the photo diode (PD) 151 is connected to a power source of the pixel area (pixel power source), the anode electrode thereof is connected to the floating diffusion (FD) through the transfer transistor 152, and the photoelectric charge is read as a photo positive hole.

The transfer transistor 152 controls reading of the photoelectric charge from the photo diode (PD) 151. The transfer transistor 152 includes a drain electrode connected to the floating diffusion and a source electrode connected to the cathode electrode of the photo diode (PD) 151. Also, a transfer control line (TRG) which transmits a transfer control signal supplied from the vertical scanning unit 112 is connected to a gate electrode of the transfer transistor 152. That is to say, the transfer control line (TRG) is included in the control line 125 in FIG. 2.

When the signal of the transfer control line (TRG) (that is to say, gate potential of the transfer transistor 152) is in an off-state, the photoelectric charge is not transferred from the photo diode (PD) 151 (the photoelectric charge is accumulated in the photo diode (PD) 151). On the other hand, when the signal of the transfer control line (TRG) is in an on-state, the photoelectric charge accumulated in the photo diode (PD) 151 is transferred to the floating diffusion (FD).

The reset transistor 153 resets potential of the floating diffusion (FD). The reset transistor 153 includes a drain electrode connected to power source potential and a source electrode connected to the floating diffusion (FD). Also, a reset control line (RST) which transmits a reset control signal supplied from the vertical scanning unit 112 is connected to a gate electrode of the reset transistor 153. That is to say, the reset control line (RST) is included in the control line 125 in FIG. 2.

When the signal of the reset control line (RST) (that is to say, gate potential of the reset transistor 153) is in an off-state, the floating diffusion (FD) is disconnected from the power source potential. On the other hand, when the signal of the reset control line (RST) is in an on-state, a charge of the floating diffusion (FD) is swept out to the power source potential and the floating diffusion (FD) is reset.

The amplification transistor 154 amplifies change in potential of the floating diffusion (FD) to output as an electric signal (analog signal). The amplification transistor 154 includes a gate electrode connected to the floating diffusion (FD), a drain electrode connected to source follower power source voltage, and a source electrode connected to a drain electrode of the select transistor 155.

For example, the amplification transistor 154 outputs the potential of the floating diffusion (FD) reset by the reset transistor 153 to the select transistor 155 as a reset signal (reset level). The amplification transistor 154 also outputs the potential of the floating diffusion (FD) to which the photoelectric charge is transferred by the transfer transistor 152 to the select transistor 155 as a light accumulation signal (signal level).

The select transistor 155 controls an output of the electric signal supplied from the amplification transistor 154 to the vertical signal line (VSL) 121 (that is to say, the A/D converter 103). The select transistor 155 includes the drain electrode connected to the source electrode of the amplification transistor 154 and a source electrode connected to the vertical signal line 121. Also, a select control line (SEL) which transmits a select control signal supplied from the vertical scanning unit 112 is connected to a gate electrode of the select transistor 155. That is to say, the select control line (SEL) is included in the control line 125 in FIG. 2.

When the signal of the select control line (SEL) (that is to say, gate potential of the select transistor 155) is in an off-state, the amplification transistor 154 is electrically disconnected from the vertical signal line 121. Therefore, in this state, the reset signal, a pixel signal and the like are not output from the unit pixel 141. On the other hand, when the select control line (SEL) is in an on-state, the unit pixel 141 is put into a selected state. That is to say, the amplification transistor 154 is electrically connected to the vertical signal line 121 and the signal output from the amplification transistor 154 is supplied to the vertical signal line 121 as the pixel signal of the unit pixel 141. That is to say, the reset signal, the pixel signal and the like are read from the unit pixel 141.

<Configuration of A/D Converter>

Figure 4:
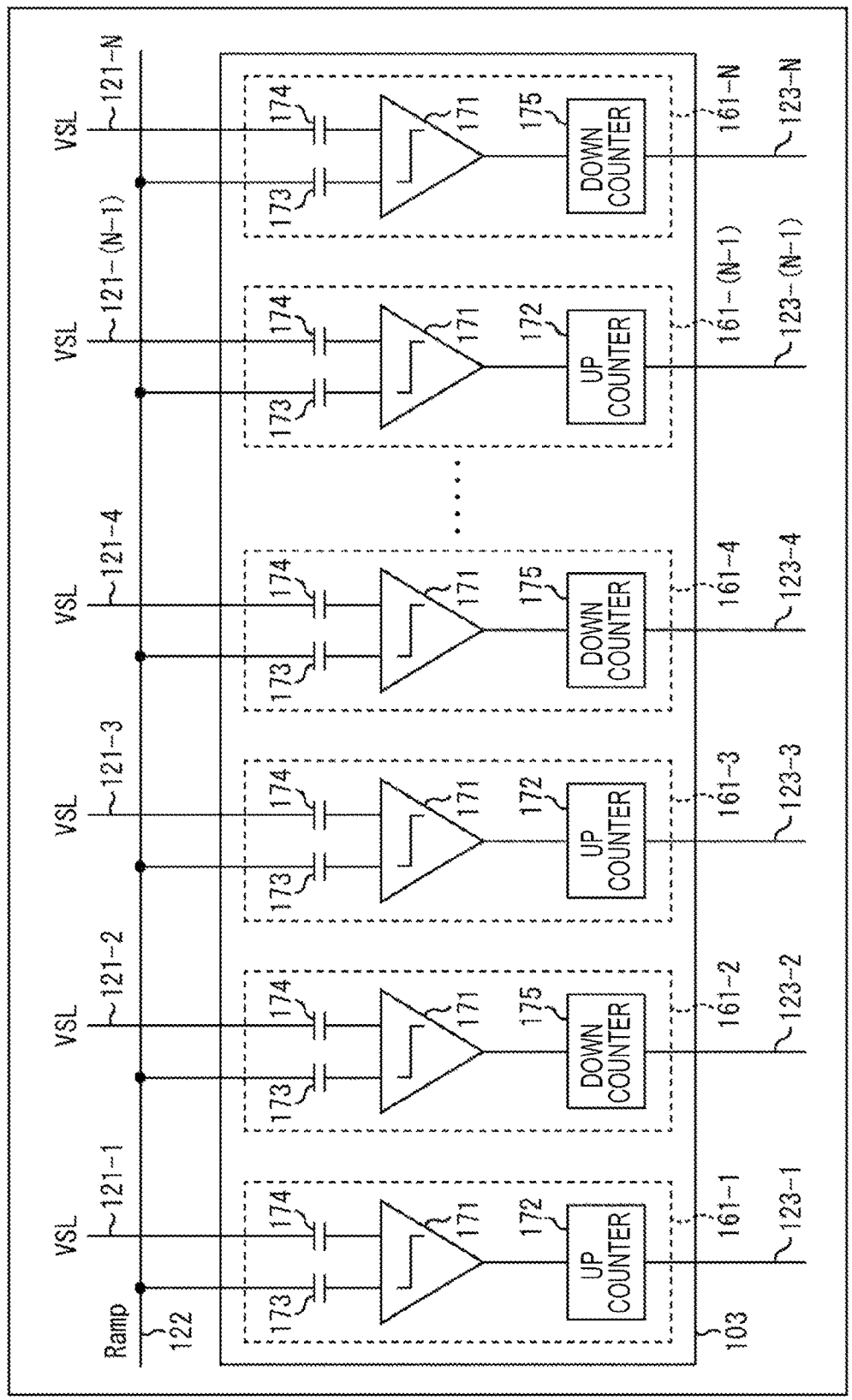
FIG. 4 is a view illustrating a principal configuration example of an A/D converter.

Next, a configuration example of the A/D converter 103 (FIG. 1) is described with reference to FIG. 4. As illustrated in FIG. 4, the A/D converter 103 includes column A/D converters 161-1 to 161-N. When it is not hereinafter necessary to distinguish the column A/D converters 161-1 to 161-N from one another to describe, they are referred to as the column A/D converters 161. The column A/D converter 161 is provided for each column (unit pixel column) in the pixel array 101.

Then, as illustrated in FIG. 4, to each of the column A/D converters 161 (column A/D converters 161-1 to 161-N), the vertical signal line 121 (vertical signal lines 121-1 to 121-N) of the column corresponding to the same and the reference signal line 122 are connected. The column A/D converter 161 performs the A/D conversion by the single slope A/D conversion system. That is to say, each column A/D converter 161 performs the A/D conversion of the signal read from the unit pixel 141 of the column corresponding to the same to be supplied through the vertical signal line 121 of the column by using the reference signal supplied from the reference voltage generating unit 102 through the reference signal line 122.

Also, as illustrated in FIG. 4, to each of the column A/D converters 161, the signal line 123 (signal lines 123-1 to 123-N) of the column corresponding to the same is connected. Each of the column A/D converters 161 supplies an A/D conversion result obtained by the same to the horizontal transfer unit 104 through the signal line 123 corresponding to the same.

Each of the column A/D converters 161 is driven on the basis of the control signal supplied from the control unit 111 through the control line 132 (that is to say, control of the control unit 111).

In FIG. 4, each of the column A/D converters 161 corresponding to odd-numbered columns from the left (for example, the column A/D converters 161-1, 161-3, . . . , and 161-(N−1)) includes a comparing unit 171, an up counter 172, and capacitors 173 and 174. Also, each of the column A/D converters 161 corresponding to even-numbered columns from the left (for example, the column A/D converters 161-2, 161-4, . . . , and 161-N) includes the comparing unit 171, the capacitors 173 and 174, and a down counter 175. Meanwhile, although the example in which N is an even number is illustrated in FIG. 4, N may also be an odd number. In this case, the column A/D converter 161-N is the odd-numbered column A/D converter 161 from the left and the column A/D converter 161-(N−1) is the even-numbered column A/D converter 161 from the left.

The comparing unit 171 compares an input signal input through the vertical signal line 121 and the capacitor 174 (for example, the analog signal read from the unit pixel 141) with the reference signal input through the reference signal line 122 and the capacitor 173 (compares the signal levels thereof) and outputs a comparison result to the up counter 172 or the down counter 175. That is to say, the comparing unit 171 outputs a signal indicating which of the input signal and the reference signal has a larger signal level.

For example, the signal indicating the comparison result is one-bit digital data. For example, when the signal level of the reference signal is larger than the signal level of the input signal, a value of the signal indicating the comparison result is set to "0", and in an opposite case, the value is set to "1".

Of course, the signal values may be set in an opposite manner. Also, the signal indicating the comparison result has an arbitrary bit length; this may also be information containing a plurality of bits.

Each of the capacitors 173 and 174 is the capacitor capacitance of which is fixed (having predetermined capacitance).

Each of the up counter 172 and the down counter 175 counts time elapsed from a start of count until the comparison result supplied from the comparing unit 171 is inverted (the signal level of the output of the comparing unit 171 changes) (for example, a clock number of a clock signal). Then, each of the up counter 172 and the down counter 175 outputs the count value up to the time at which the comparison result is inverted as the A/D conversion result of the input signal (that is to say, the digital data of the signal read from the unit pixel 141) to the horizontal transfer unit 104 through the signal line 123. Meanwhile, the count values output by the up counter 172 and the down counter 175 have arbitrary bit lengths (digit numbers).

The up counter 172 and the down counter 175 are the counters with the same count timing but with opposite polarities of the count values. For example, the up counter 172 starts counting from a state in which all the bits are set to "0" and increases (increments) the count value by "1" for each count. On the other hand, the down counter 175 starts counting from a state in which all the bits are set to "1", for example, and decreases (decrements) the count value by "1" for each count. The up counter 172 and the down counter 175 count in this manner at the same timing.

The power source variation is generated by the driving of the up counter 172 and the down counter 175; in the image sensor 100, the column A/D converters 161-1 to 161-N having such configurations are arranged in the vicinity of one another such that the power source variations thereof affect one another.

<Configuration of Counter>

Next, a configuration example of the up counter 172 and the down counter 175 is described with reference to FIG. 5. A binary counter may be used, for example, as each of the up counter 172 and the down counter 175. The up counter 172 may be formed of a non-synchronous counter including a plurality of JK flip-flops (for example, JK flip-flops 181-1, 181-2, 181-3 and the like) combined as in A of FIG. 5, for example. Similarly, the down counter 175 may be formed of a non-synchronous counter including a plurality of JK flip-flops (for example, JK flip-flops 181-1, 181-2, 181-3 and the like) combined as in B of FIG. 5, for example. When it is not hereinafter required to distinguish the JK flip-flops from one another to describe, they are referred to as the JK flip-flops 181.

Figure 5:
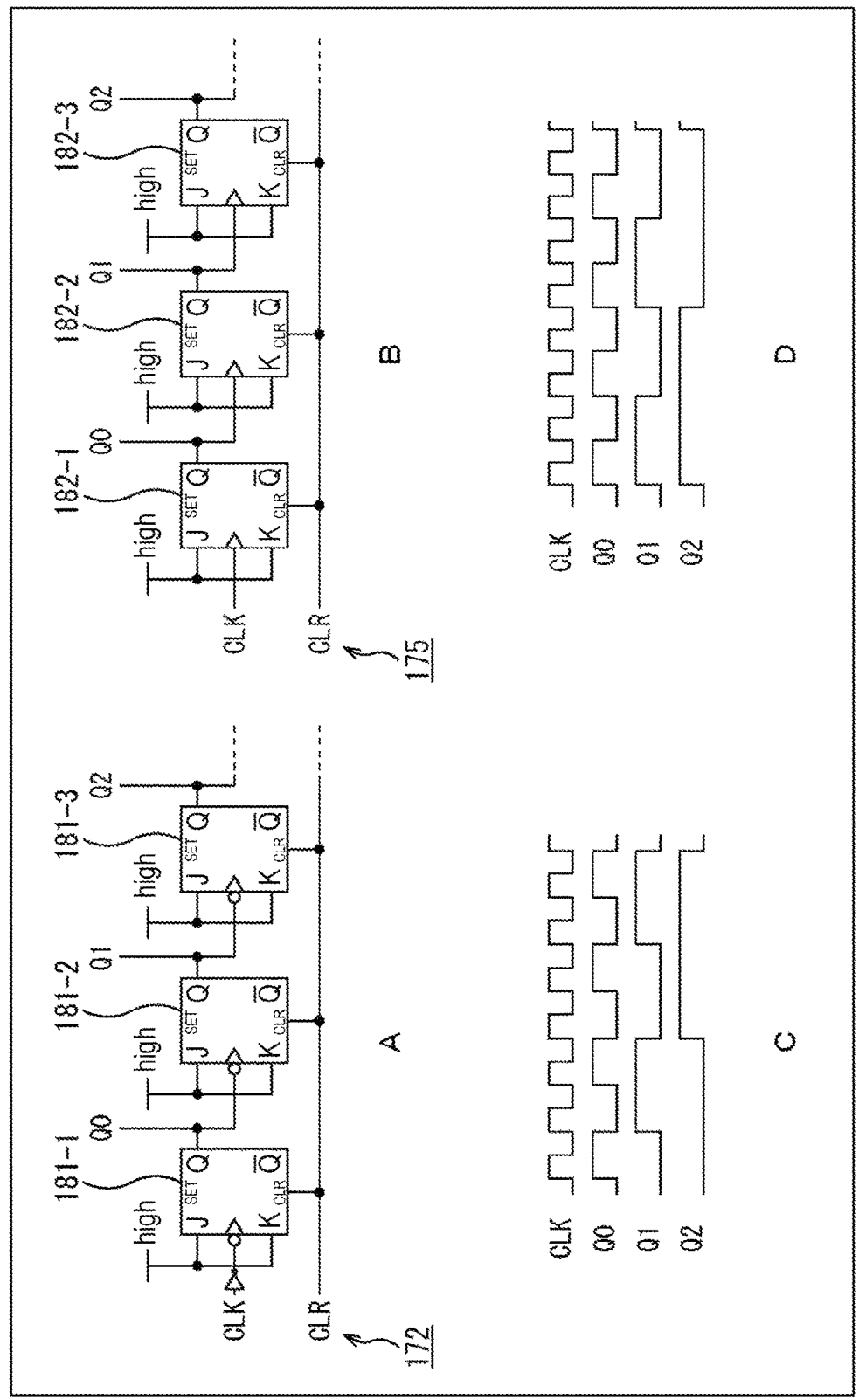
FIG. 5 is a view illustrating a principal configuration example of a counter.

The counter having the configuration illustrated in A of FIG. 5 outputs the count value as in an example of C in FIG. 5 when the count value is a three-bit value. Also, the counter having the configuration illustrated in B of FIG. 5 outputs the count value as in an example of D in FIG. 5 when the count value is a three-bit value. In the A/D converter 103 (each column A/D converter 161), the count timings are matched and the count value is output as in an example in FIG. 6. A of FIG. 6 illustrates an example of the count value (four-bit) output by the up counter 172 and B of FIG. 6 illustrates an example of the count value (four-bit) output by the down counter 175. In this manner, the count timing of the up counter 172 and that of the down counter 175 are the same and the polarities of the count values are opposite to each other. Therefore, each bit of the count value varies in opposite directions at the same time. For example, BIT1 of the down counter 175 changes from high to low at the same time as BIT1 of the up counter 172 changes from low to high. The same applies to other bits.

<Comparison of Power Source Variation>

Figure 7:
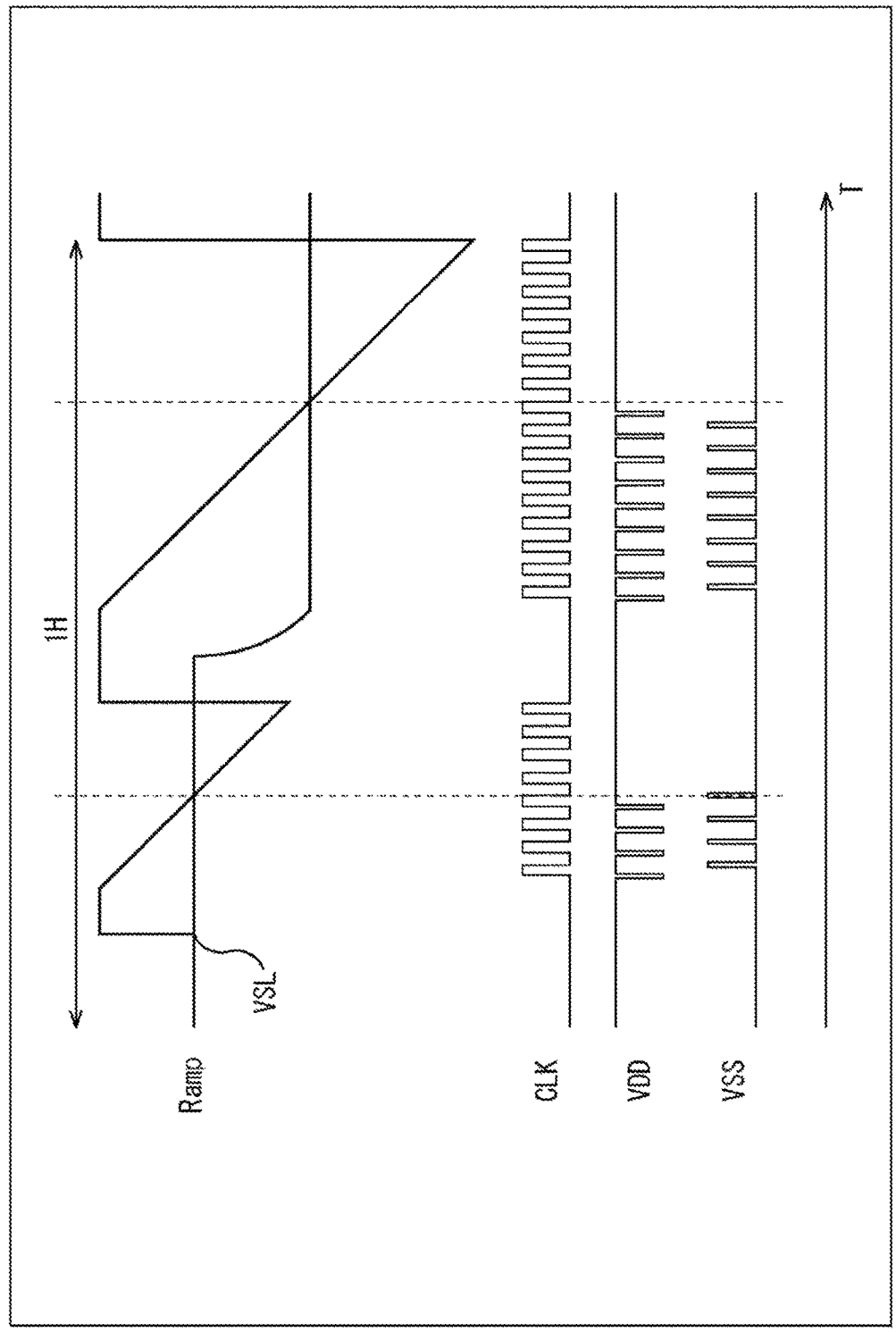
FIG. 7 is a timing chart illustrating an example of a state of power source variation.

When the same counter is used in all the column A/D converters as in a general image sensor, variation timings of the power source variation occurring in both VDD and VSS are shifted from each other and both of them are large variations as in an example illustrated in FIG. 7.

Figure 8:
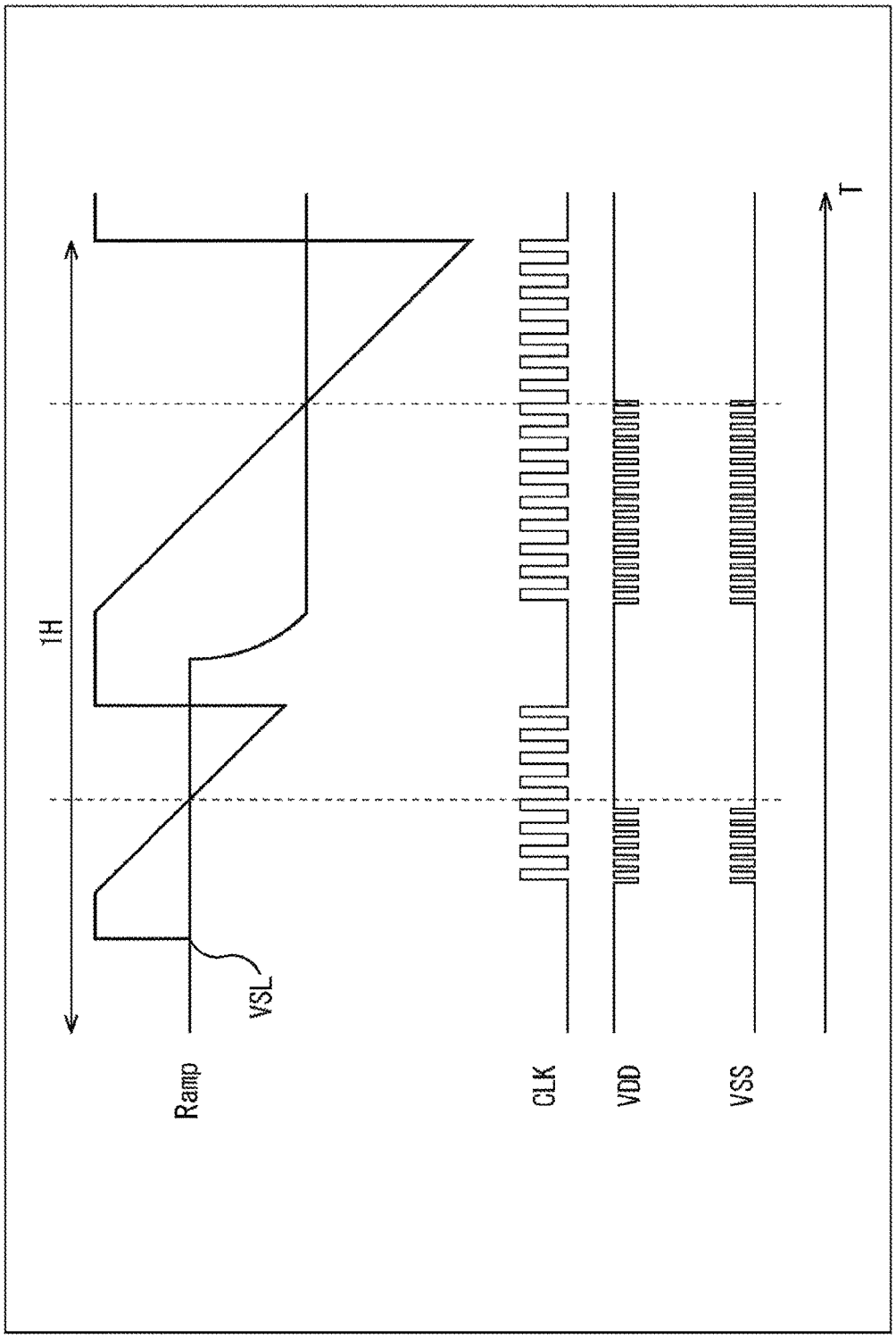
FIG. 8 is a timing chart illustrating an example of the state of the power source variation.

On the other hand, the timing of the power source variation of VDD and that of VSS coincide with each other as in an example illustrated in FIG. 8 by using the column A/D converter 161 including the up counter 172 and the column A/D converter 161 including the down counter 175 as in the example in FIG. 4, so that they cancel each other and a variation range thereof is made small.

Figure 9:
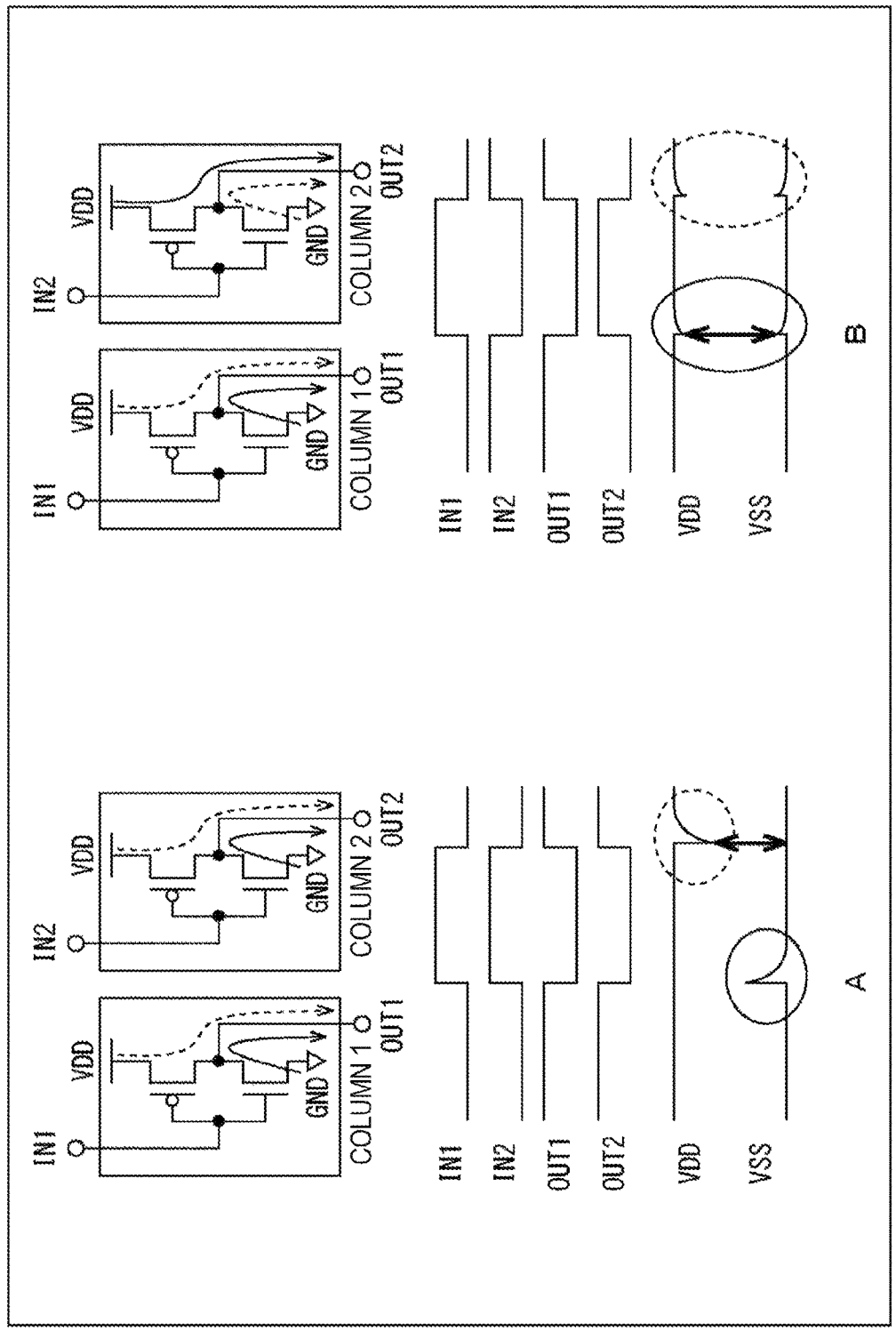
FIG. 9 is a view illustrating the power source variation when the counter operates.

When this is more specifically described, when the same counter is used in all the column A/D converters as in the general image sensor, a direction of change of the signal level of an input/output terminal in all the columns is the same as illustrated in A of FIG. 9, so that the power source variation of VDD and the power source variation of VSS are concentrated at different timings. Therefore, the power source variations of both of them become large.

On the other hand, when the column A/D converter 161 including the up counter 172 and the column A/D converter 161 including the down counter 175 are used as in the example in FIG. 4, the directions of the change of the signal level of the input/output terminal are different in all the columns as illustrated in B of FIG. 9, so that the power source variation of VDD and the power source variation of VSS are divided into both the power source variation timing of VDD and the power source variation timing of VSS in the example in A of FIG. 9. Therefore, a peak of the power source variation of both of them is suppressed. Furthermore, since the power source variation of VDD and the power source variation of VSS occur at the same timing, they cancel each other, so that the peak of the power source variation is further suppressed.

In this manner, the power source and GND operate at the same time in the opposite directions, so that a mirror effect is obtained. According to this, the decoupling capacitance seems to be large and the power source variation may be further suppressed even with the same capacitance as that of the conventional one. In other words, the decoupling capacitance may be further decreased when a variation amount may be the same.

<AC Characteristic>

Frequency characteristics (AC characteristics) of the A/D converter 103 including both the column A/D converter 161 including the up counter 172 and the column A/D converter 161 including the down counter 175 in this manner and the general A/D converter including only one of the column A/D converter 161 including the up counter 172 and the column A/D converter 161 including the down counter 175 are compared with each other.

Figure 10:
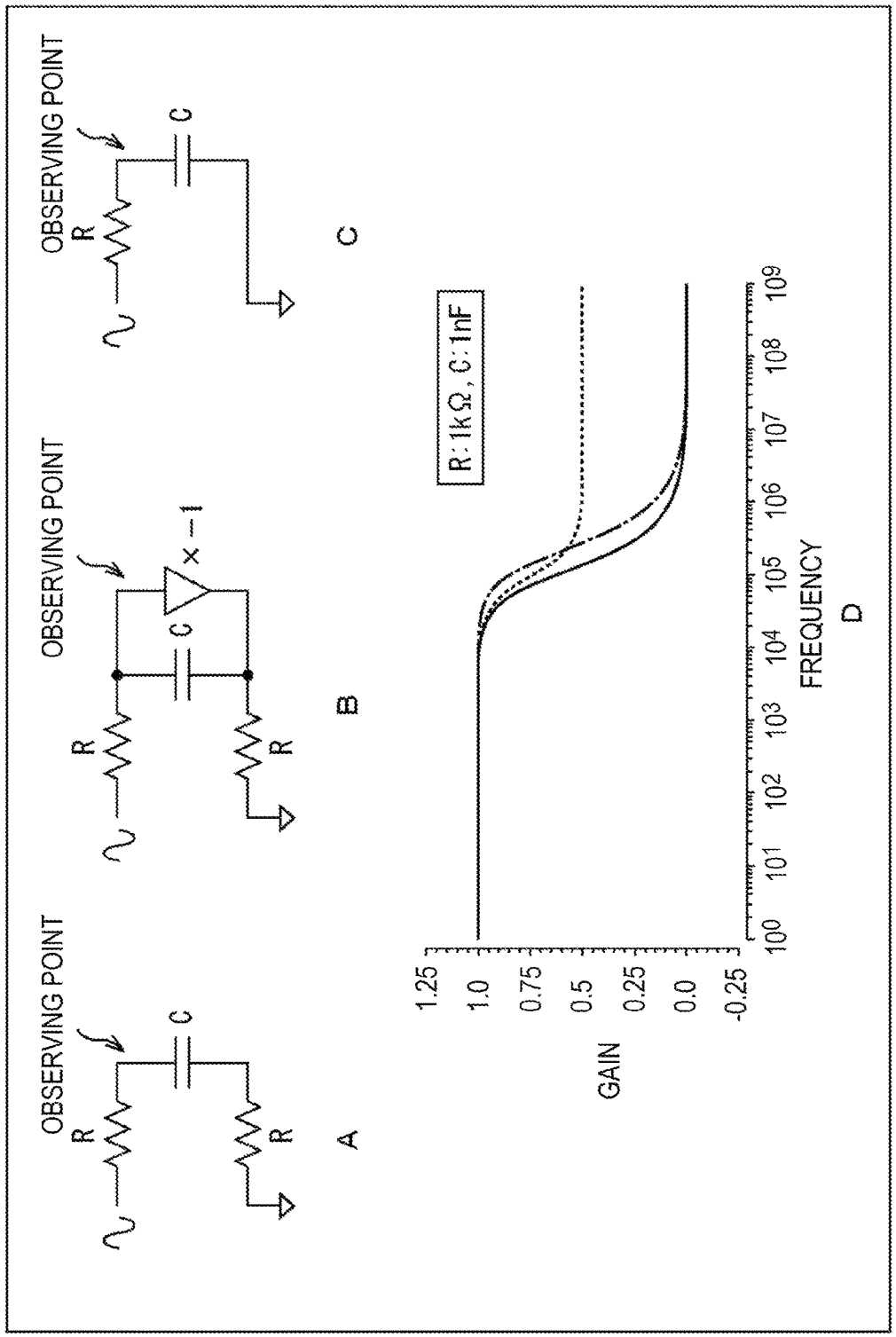
FIG. 10 is a view illustrating a state of simulation regarding an AC characteristic.

A of FIG. 10 illustrates a circuit representing the general A/D converter including only one of the column A/D converter 161 including the up counter 172 and the column A/D converter 161 including the down counter 175. B of FIG. 10 illustrates a circuit representing the A/D converter 103 including both the column A/D converter 161 including the up counter 172 and the column A/D converter 161 including the down counter 175. C of FIG. 10 is a circuit representing an ideal low pass filter.

A result of comparison of simulation of the frequency characteristics by using the circuits is illustrated in D of FIG. 10. In a graph illustrated in D of FIG. 10, a dotted line indicates the frequency characteristic of the circuit illustrated in A of FIG. 10 (that is to say, the general A/D converter including only one of the column A/D converter 161 including the up counter 172 and the column A/D converter 161 including the down counter 175). Also, a solid line indicates the frequency characteristic of the circuit illustrated in B of FIG. 10 (that is to say, the A/D converter 103 including both the column A/D converter 161 including the up counter 172 and the column A/D converter 161 including the down counter 175) and a dashed-dotted line indicates the frequency characteristic of the circuit illustrated in C of FIG. 10 (that is to say, the ideal low pass filter).

As illustrated in the graph in D of FIG. 10, the A/D converter 103 may suppress a high-frequency component as compared to the general A/D converter and further, the ideal low pass filter. Especially, in a case of the above-described general A/D converter, a counter electrode also has resistance and a high-frequency gain is approximately 0.5; however, in a case of the A/D converter 103, it is possible to suppress the high-frequency gain to approximately "0" as in a case of the ideal low pass filter. Since this is equivalent to a case in which a capacitance value of the decoupling capacitance is twice due to the mirror effect, a cutoff frequency may be made half.

Meanwhile, if a counter electrode power source line of the decoupling capacitance has no resistance, a filter effect decreases; however, the effect similar to that when the counter electrode power source line does not have the resistance as in a case of the ideal low pass filter may be obtained and the gain of the high-frequency component may be further suppressed.

<Characteristic with Actual Load>

Next, simulation of the characteristic with an actual load when both the up counter and the down counter with the same count timing and the opposite polarities of the count values are used is described.

Figure 11:
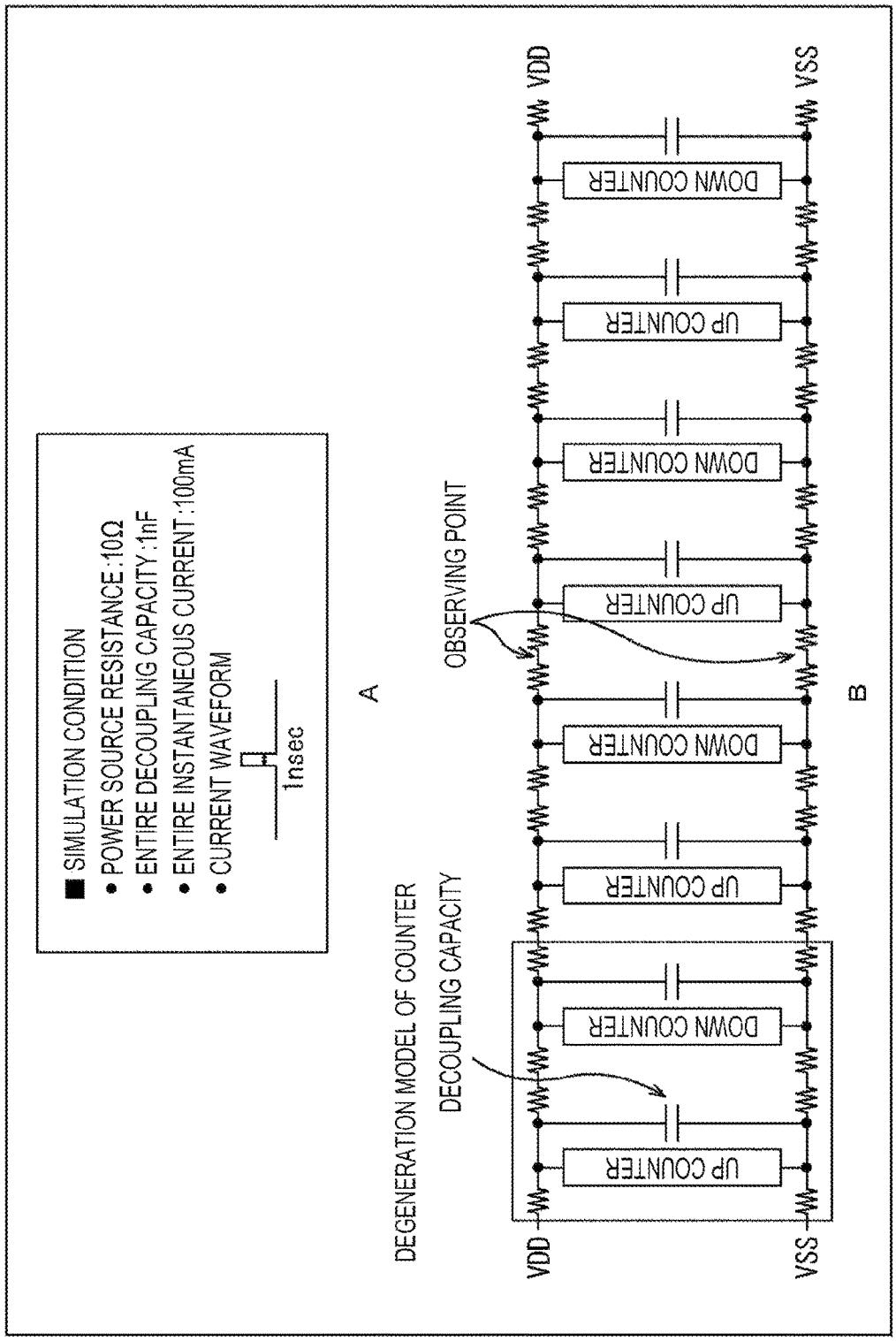
FIG. 11 is a view illustrating a state of simulation regarding a characteristic with an actual load.

The simulation is executed by using a circuit having a configuration illustrated in B of FIG. 11 while setting a simulation condition as in A of FIG. 11. Then, a simulation result of the circuit illustrated in B of FIG. 11 (that is to say, the circuit representing the A/D converter 103 to which the present technology is applied) and a simulation result of the circuit obtained by making the counter included in the circuit illustrated in B of FIG. 11 only the up counter or the down counter (that is to say, the circuit representing the general A/D converter) are compared with each other.

Figure 12:
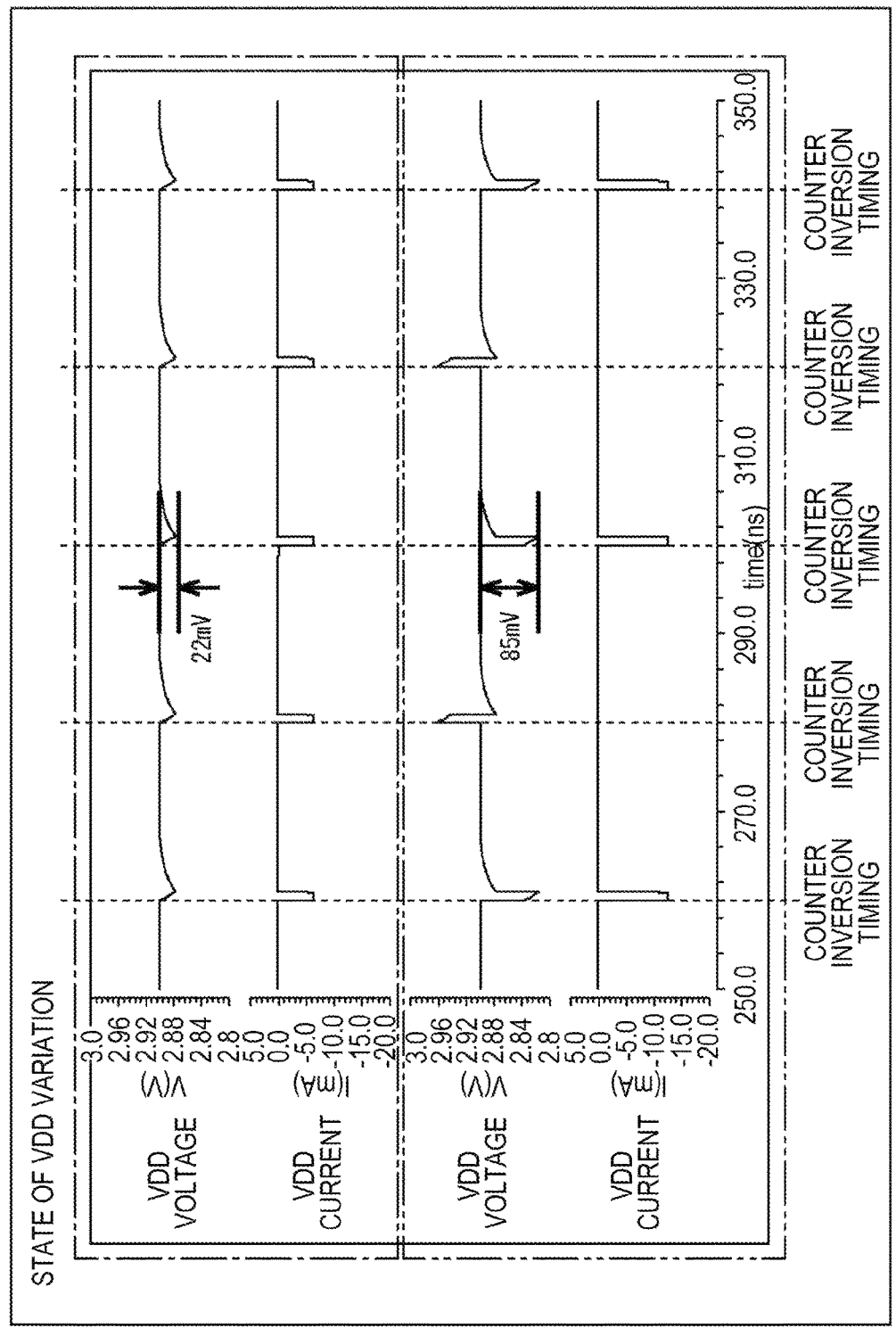
FIG. 12 is a view illustrating a state of the simulation regarding the characteristic with the actual load.

Regarding the simulation results of the circuits, comparison of VDD voltage and VDD current observed at an observing point illustrated in B of FIG. 11 is illustrated in FIG. 12. The VDD voltage and VDD current on an upper side of FIG. 12 indicate the simulation result of the circuit illustrated in B of FIG. 11 and the VDD voltage and VDD current on a lower side indicate the simulation result of the circuit obtained by making the counter included in the circuit illustrated in B of FIG. 11 only the up counter or the down counter.

As illustrated in FIG. 12, the circuit illustrated in B of FIG. 11 (that is to say, the circuit representing the A/D converter 103 to which the present technology is applied) may suppress the peak of the variation of the VDD voltage as compared to the circuit obtained by making the counter included in the circuit illustrated in B of FIG. 11 only the up counter or the down counter (that is to say, the circuit representing the general A/D converter).

Figure 13:
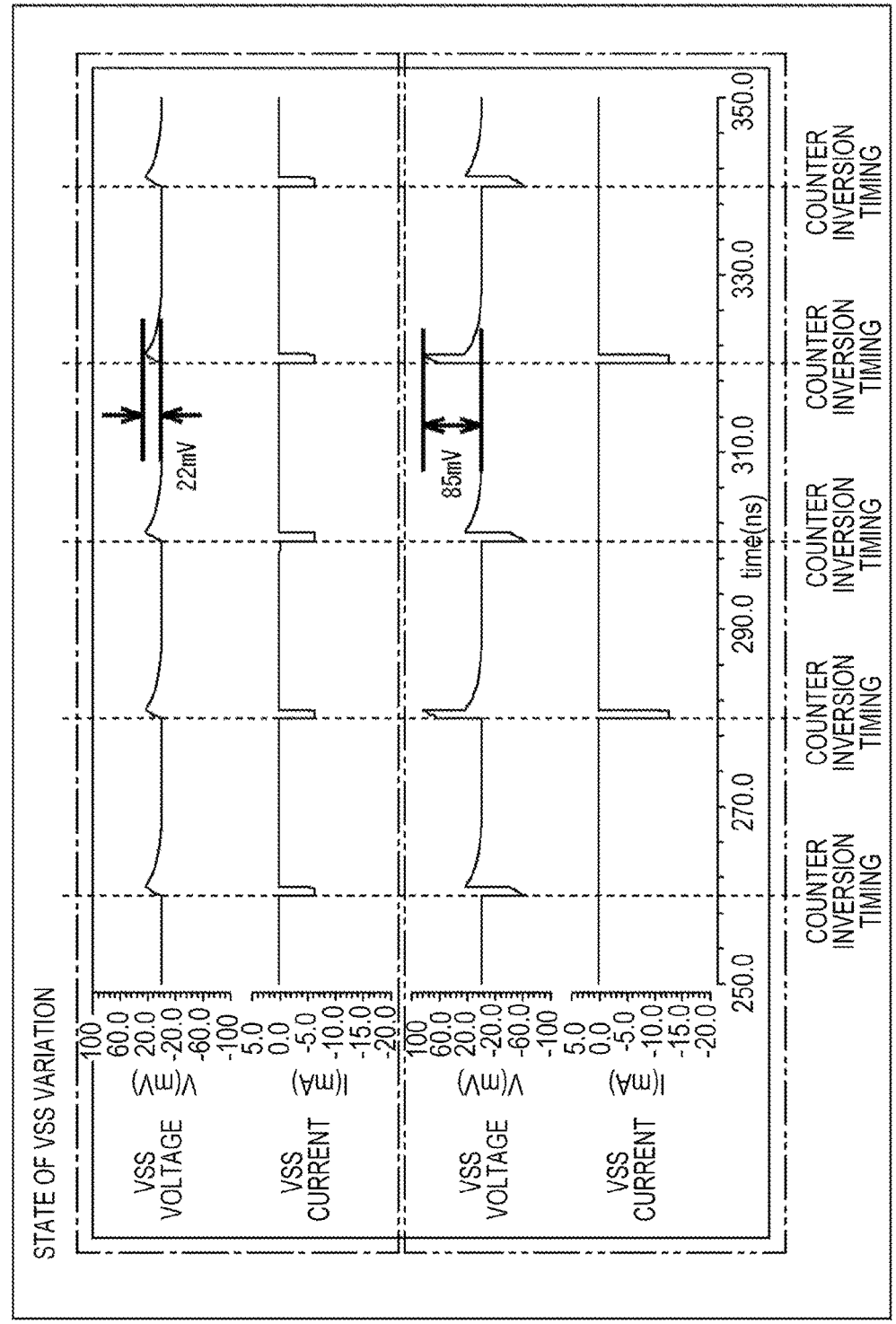
FIG. 13 is a view illustrating a state of the simulation regarding the characteristic with the actual load.

Also, comparison of VSS voltage and VSS current observed at the observing point illustrated in B of FIG. 11 is illustrated in FIG. 13. The VSS voltage and VSS current on an upper side of FIG. 13 indicate the simulation result of the circuit illustrated in B of FIG. 11 and the VSS voltage and VSS current on a lower side indicate the simulation result of the circuit obtained by making the counter included in the circuit illustrated in B of FIG. 11 only the up counter or the down counter.

As illustrated in FIG. 12, the circuit illustrated in B of FIG. 11 (that is to say, the circuit representing the A/D converter 103 to which the present technology is applied) may suppress the peak of the variation of the VSS voltage as compared to the circuit obtained by making the counter included in the circuit illustrated in B of FIG. 11 only the up counter or the down counter (that is to say, the circuit representing the general A/D converter).

As described above, the A/D converter 103 may suppress the power source variation due to the driving of the counter. According to this, the column A/D converter 161 (A/D converter 103) may perform the A/D conversion more correctly. Then, the image sensor 100 may inhibit the image quality of the captured image obtained by the image sensor 100 from deteriorating.

Also, according to this, it is possible to decrease the operation margin of the counter and decrease the power source voltage.

<Another Example of Configuration of Counter>

Meanwhile, the configurations of the up counter 172 and the down counter 175 described above are arbitrary, and they are not limited to the examples in FIG. 5. For example, although it is described to use the non-synchronous up counter and down counter in FIG. 5, a non-synchronous up/down counter as illustrated in A of FIG. 14 may also be used. As illustrated in A of FIG. 14, the non-synchronous up/down counter is formed of the JK flip-flop 181 and selectors (selectors 201-1, 201-2, and the like). When it is not required to distinguish the selectors from one another to describe, they are referred to as the selectors 201.

Figure 14:
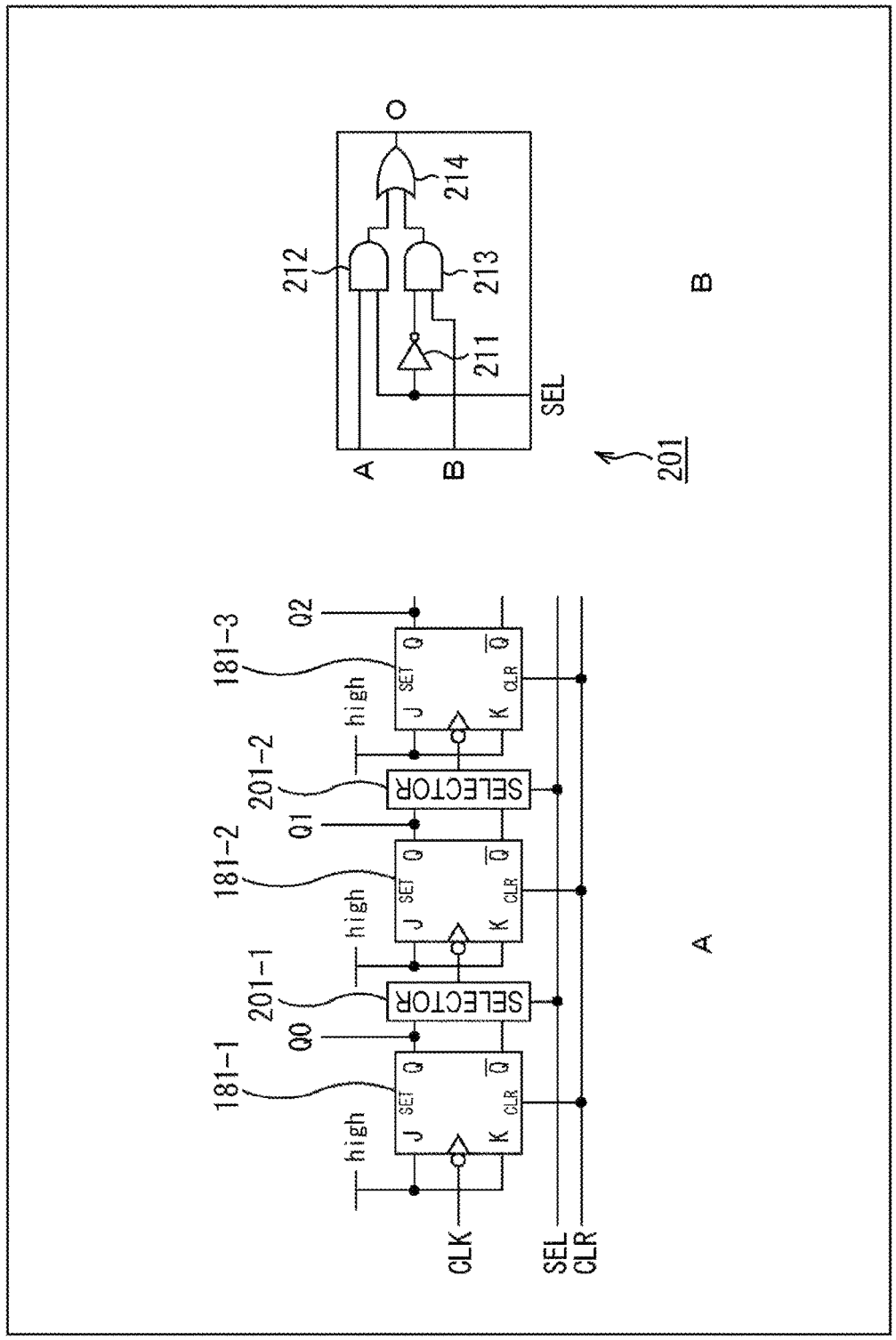
FIG. 14 is a view illustrating another configuration example of the counter.

A configuration of the selector 201 is arbitrary; this may have the configuration as illustrated in B of FIG. 14, for example. In an example in B of FIG. 14, the selector 201 including a NOT 211, an AND 212, an AND 213, and an OR 214 selects one of two outputs of the JK flip-flop 181 of a precedent stage. By selecting the selector 201, the non-synchronous up/down counter may operate as the up counter and the down counter.

That is to say, it is possible to allow the non-synchronous up/down counter illustrated in A of FIG. 14 to operate as the up counter and make the same the up counter 172, and allow the non-synchronous up/down counter illustrated in A of FIG. 14 to operate as the down counter and make the same the down counter 175. According to this, the configuration of the column A/D converter 161 using the up counter 172 and the configuration of the column A/D converter 161 using the down counter 175 may be made the same, so that difference in characteristic between the columns generated due to difference in configuration may be reduced.

Figure 15:
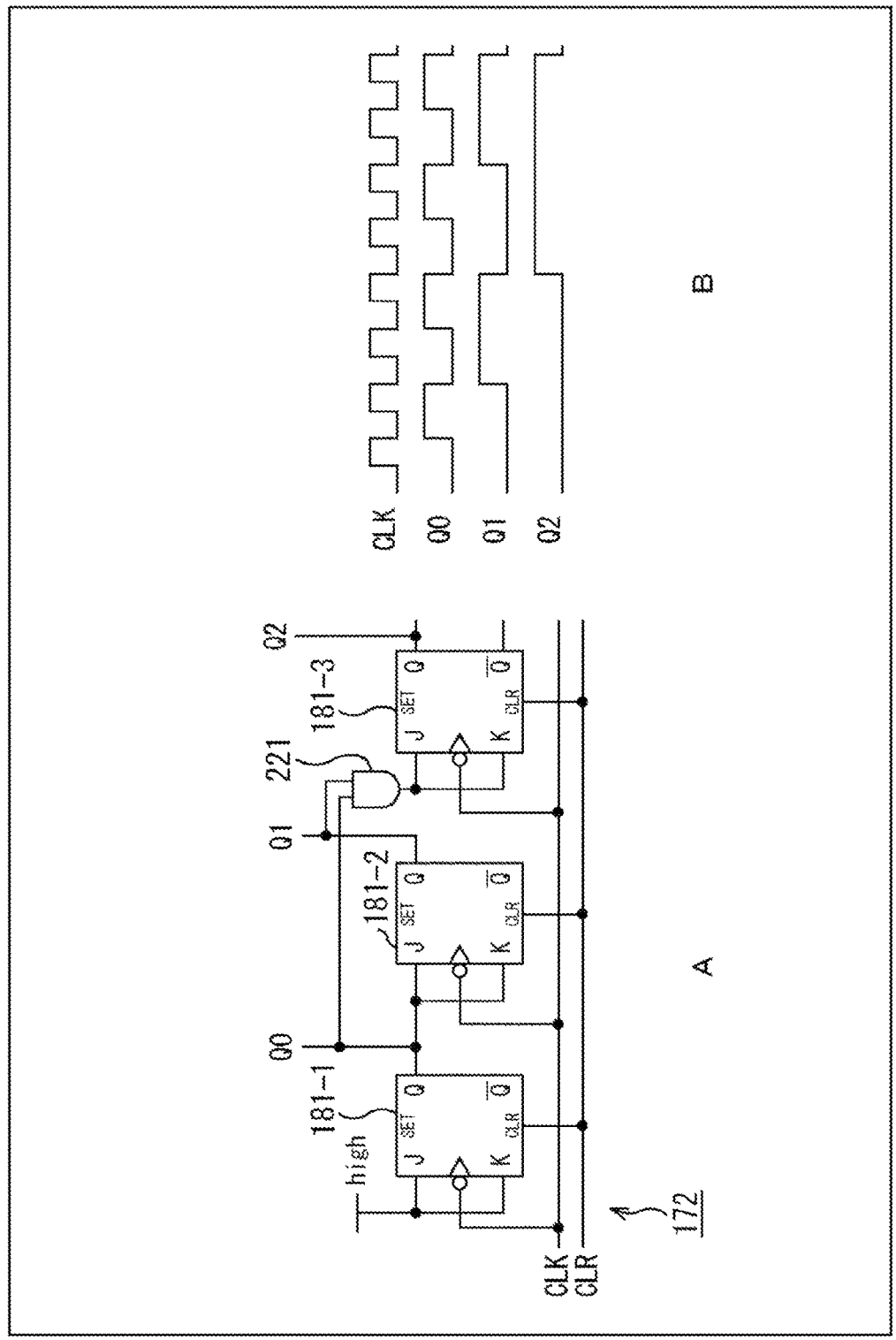
FIG. 15 is a view illustrating another configuration example of the counter.

A synchronous counter may also be used. For example, a synchronous up counter including a plurality of JK flip-flops 181 and the AND 221 combined as illustrated in A of FIG. 15 may be used as the up counter 172. An example of a waveform of the count value of the counter is illustrated in B of FIG. 15. In this case, a synchronous down counter may be used also as the down counter 175.

Figure 16:
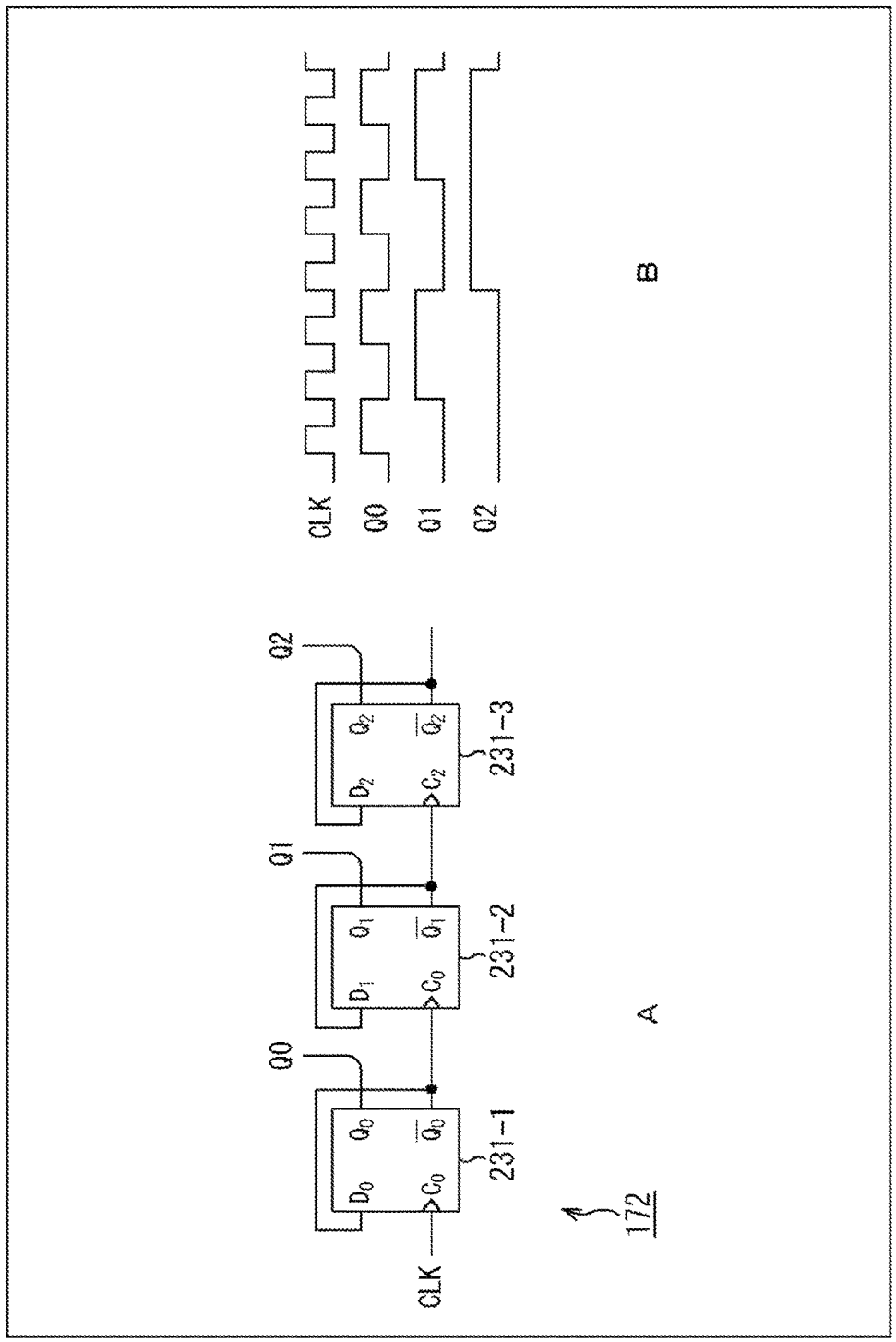
FIG. 16 is a view illustrating another configuration example of the counter.

A counter using a D flip-flop may also be applied. For example, a non-synchronous up counter including a plurality of D flip-flops (D flip-flops 231-1, 231-2, 231-3 and the like) combined as illustrated in A of FIG. 16 may be used as the up counter 172. When it is not hereinafter required to distinguish the D flip-flops from one another to describe, they are referred to as the D flip-flops 231. An example of the waveform of the count value of the counter is illustrated in B of FIG. 16. In this case, a non-synchronous down counter including the D flip-flops 231 may also be used as the down counter 175.

Furthermore, not the binary counter but a gray code counter (the up counter using a gray code is also referred to as a gray code up counter; the down counter in which each bit is inverted is also referred to as a gray code down counter) may be used as the up counter 172 and the down counter 175. An example of a waveform of each bit of the count value output from the gray code up counter is illustrated in A of FIG. 17 and an example of a waveform of each bit of the count value output from the gray code down counter is illustrated in B of FIG. 17.

Figure 18:
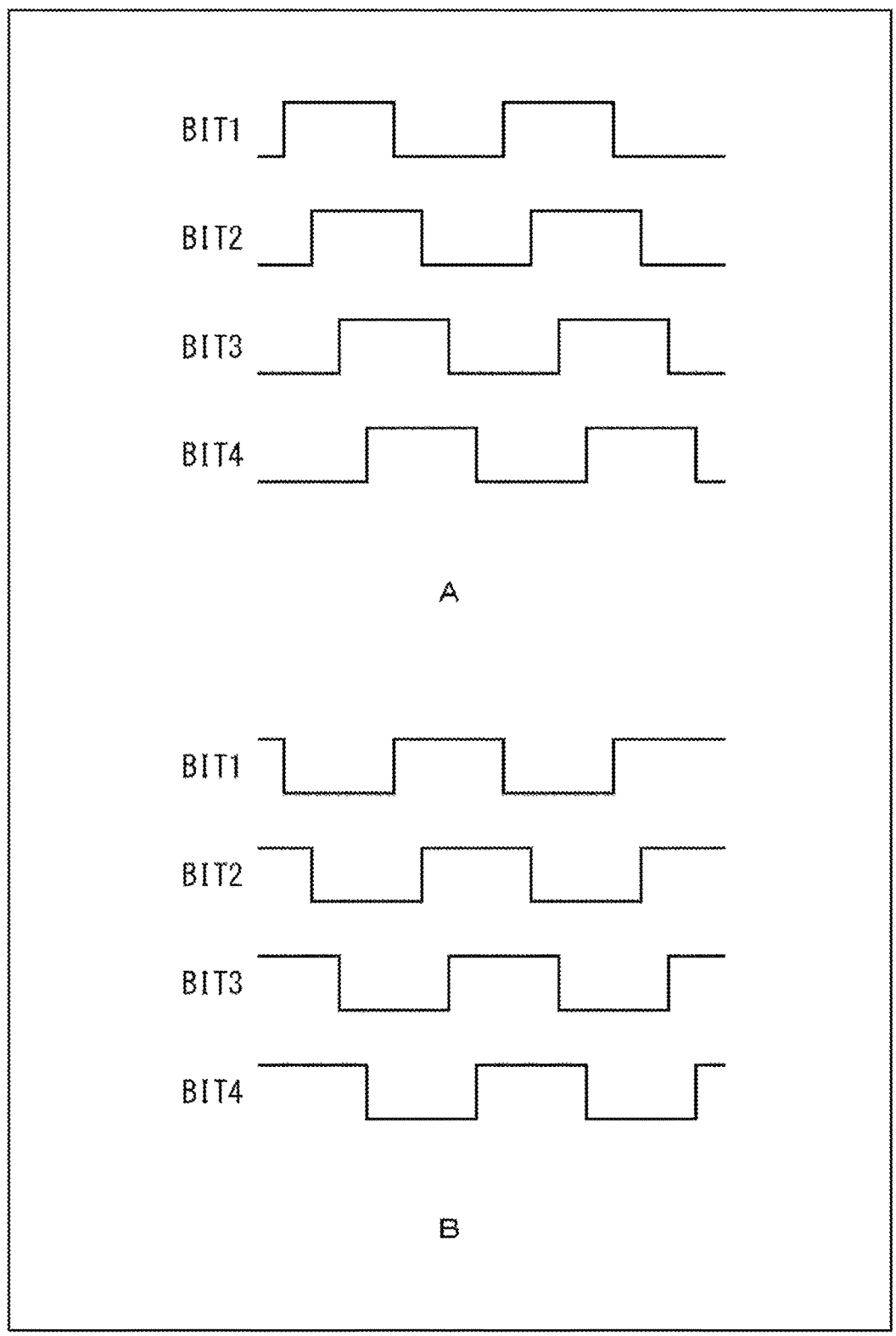
FIG. 18 is a timing chart illustrating another example of the counter.

Furthermore, not the binary counter but a counter using a time to digital converter (TDC) (also referred to as a TDC counter; the up counter using the TDC is also referred to as a TDC up counter, and the down counter using the TDC is also referred to as a TDC down counter) may be used as the up counter 172 and the down counter 175. An example of the waveform of each bit of the count value output from the TDC up counter is illustrated in A of FIG. 18 and an example of the waveform of each bit of the count value output from the TDC down counter is illustrated in B of FIG. 18.

In all the cases, the A/D converter 103 may suppress the power source variation due to the driving of the counter by making the count timing of the up counter 172 and that of the down counter 175 the same and making the polarities of the count values opposite.

<Another Configuration of Column A/D Converter>

In addition, although the configuration example of the column A/D converter 161 is described with reference to FIG. 4, the configuration of the column A/D converter 161 is arbitrary. The A/D conversion system of the column A/D converter 161 is also arbitrary and the A/D conversion may also be performed by a system other than the single slope A/D conversion system.

For example, the column A/D converter 161 may perform the A/D conversion by an integral type A/D conversion system. The configuration example of the column A/D converter 161 in this case is illustrated in FIG. 19.

Figure 19:
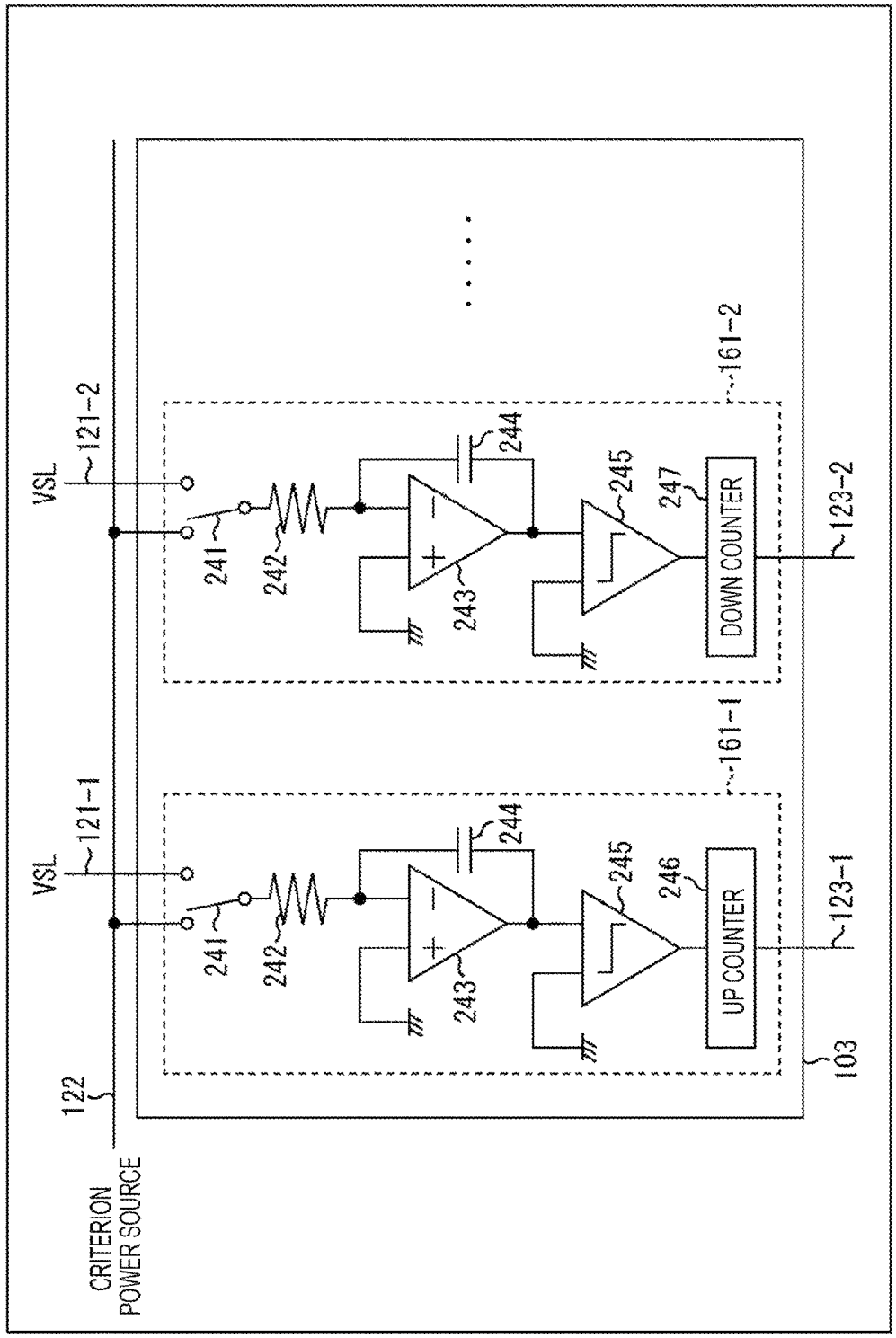
FIG. 19 is a view illustrating another configuration example of a column A/D converter.

In this case, as illustrated in FIG. 19, the column A/D converter 161-1 includes a switch 241, resistance 242, an integrating unit 243, a capacitor 244, a comparing unit 245, and an up counter 246. In contrast, the column A/D converter 161-2 includes the switch 241, the resistance 242, the integrating unit 243, the capacitor 244, the comparing unit 245, and a down counter 247.

That is to say, as in the case of the example in FIG. 4, the column A/D converter 161 including the up counter 246 and the column A/D converter 161 including the down counter 247 are alternately arranged. That is to say, a plurality of column A/D converters 161 having such configurations is arranged in the vicinity of each other such that the power source variations affect each other. Then, the up counter 246 and the down counter 247 operate with the same count timing and the opposite polarities of the count values.

Also when the column A/D converter 161 performs the A/D conversion by the integral type A/D conversion system in this manner, the power source variation occurs due to the operation of the up counter 246 and the down counter 247. Therefore, by configuring in the above described manner, the timings of the power source variations of VDD and VSS coincide with each other to cancel each other, so that the power source variation range is made small. That is to say, in this case also, the A/D converter 103 may suppress the power source variation due to the driving of the counter.

Although it is described above to apply the A/D converter 103 to which the present technology is applied to the image sensor and perform the A/D conversion on the pixel signal and the like read from the pixel area, the analog signal on which the A/D conversion is performed by the A/D converter 103 to which the present technology is applied is arbitrary and it is possible to perform the A/D conversion on the signal other than the pixel signal. For example, this may also be an audio signal output from a microphone and the like, a motor output and the like. That is to say, the A/D converter 103 to which the present technology is applied may be applied to an arbitrary device which performs the A/D conversion on the analog signal other than the image sensor. Especially, a larger effect may be obtained by applying the same to a device which performs the A/D conversion on a large number of analog signals in parallel by using a plurality of A/D converters arranged in the vicinity of one another.

In addition, although the present technology is described above by using the A/D converter which performs the A/D conversion by using the counter as an example, the process performed by using the counter is not limited to the A/D conversion but may be any process. That is to say, the present technology may be applied to an arbitrary processor which performs a process by using a plurality of counters.

<Arrangement of Counter>

Meanwhile, although it is described above to arrange the column A/D converter including the up counter and the column A/D converter including the down counter in the vicinity of each other, the column A/D converters may be arranged in arbitrary positions as long as they are arranged in the vicinity of each other. For example, it is possible that the column A/D converter 161 each including the up counter 172 and the column A/D converter 161 each including the down counter 175 are alternately arranged in one row as illustrated in A of FIG. 20. For example, it is also possible that a plurality of column A/D converters 161 each including the up counter 172 and a plurality of column A/D converters 161 each including the down counter 175 are alternately arranged in one row as illustrated in B of FIG. 20. By arranging each column A/D converter 161 as in the examples, it is possible to arrange the up counter 172 and the down counter 175 in the vicinity of each other, thereby suppressing the power source variation due to the driving of the counter.

Meanwhile, the position in which the column A/D converter is arranged is not limited to the above-described example. For example, the column A/D converters may be arranged in a plurality of rows. Also, the number of the column A/D converters 161 each including the up counter 172 and the number of the column A/D converters 161 each including the down counter 175 are not necessarily the same.

Furthermore, it is also possible to arrange the counter of each column A/D converter 161 in a predetermined position in an area in which the column A/D converter 161 is arranged. For example, it is also possible to arrange the counter (up counter 172 or down counter 175) on a lower side in the drawing of the column A/D converter 161 as in the example in FIG. 20.

Figure 20:
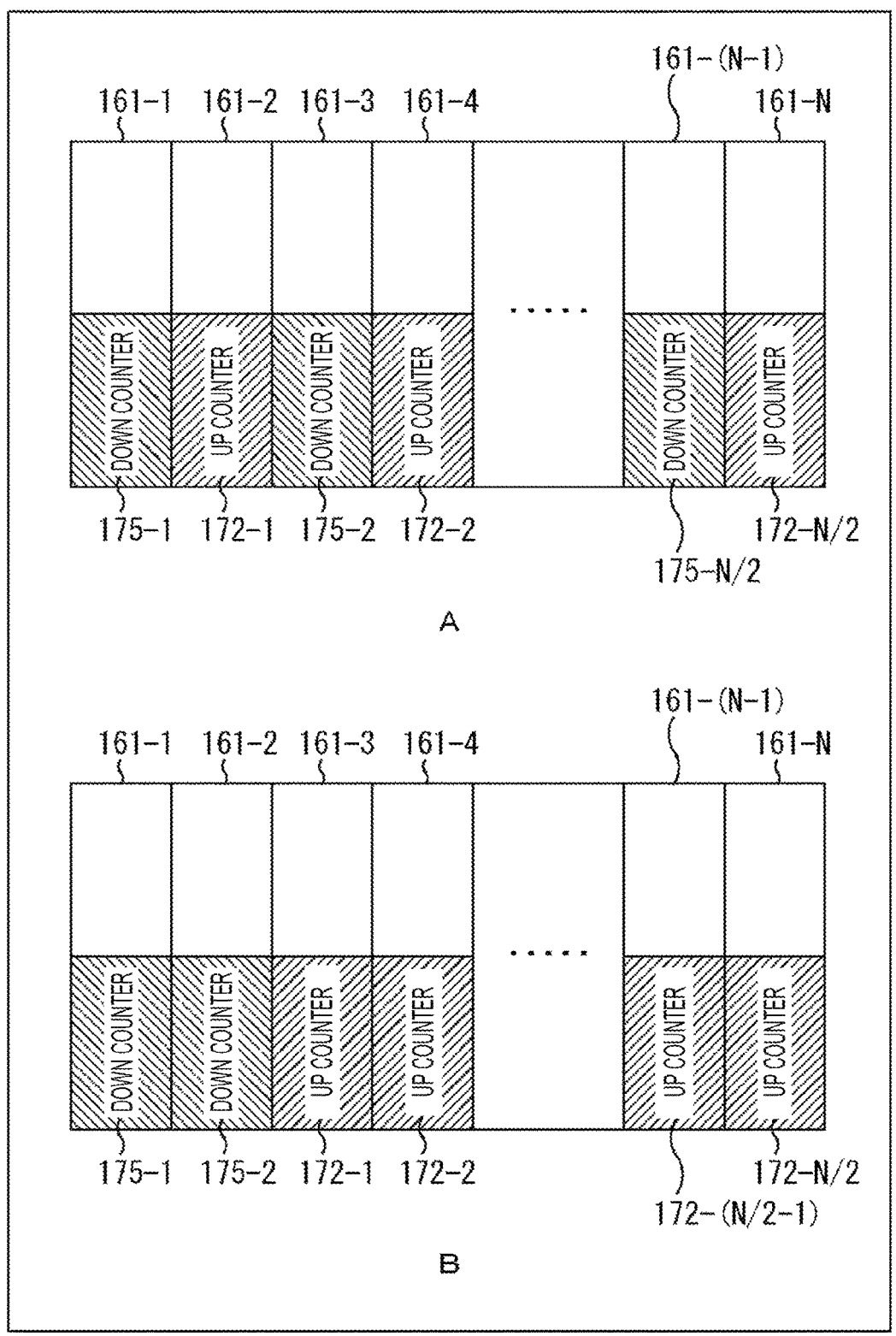
FIG. 20 is a view illustrating an arrangement example of the counter.

By configuring in this manner, the up counter 172 and the down counter 175 are alternately arranged in one row in a case of the example in A of FIG. 20. Also, a plurality of up counters 172 and a plurality of down counters 175 are alternately arranged in one row in a case of the example in B of FIG. 20. That is to say, it is possible to arrange the up counter 172 and the down counter 175 so as to be closer to each other and suppress the power source variation due to the driving of the counter.

Of course, the position of the counter in the column A/D converter is arbitrary and an example other than this is also possible. For example, not all the positions of the counters in the respective column A/D converters (any processor which uses the counter) must be the same. Also, not all the numbers of the counters included in the respective column A/D converters (any processor which uses the counter) must be the same.

<Physical Configuration of Image Sensor>

Meanwhile, the image pickup element to which the present technology is applied may be realized as a package (chip) in which a semiconductor substrate is enclosed, a module obtained by installing the package (chip) on a circuit substrate and the like, for example. For example, when this is realized as the package (chip), the image pickup element may be formed of a single semiconductor substrate in the package (chip) or formed of a plurality of semiconductor substrates superimposed on each other.

Figure 21:
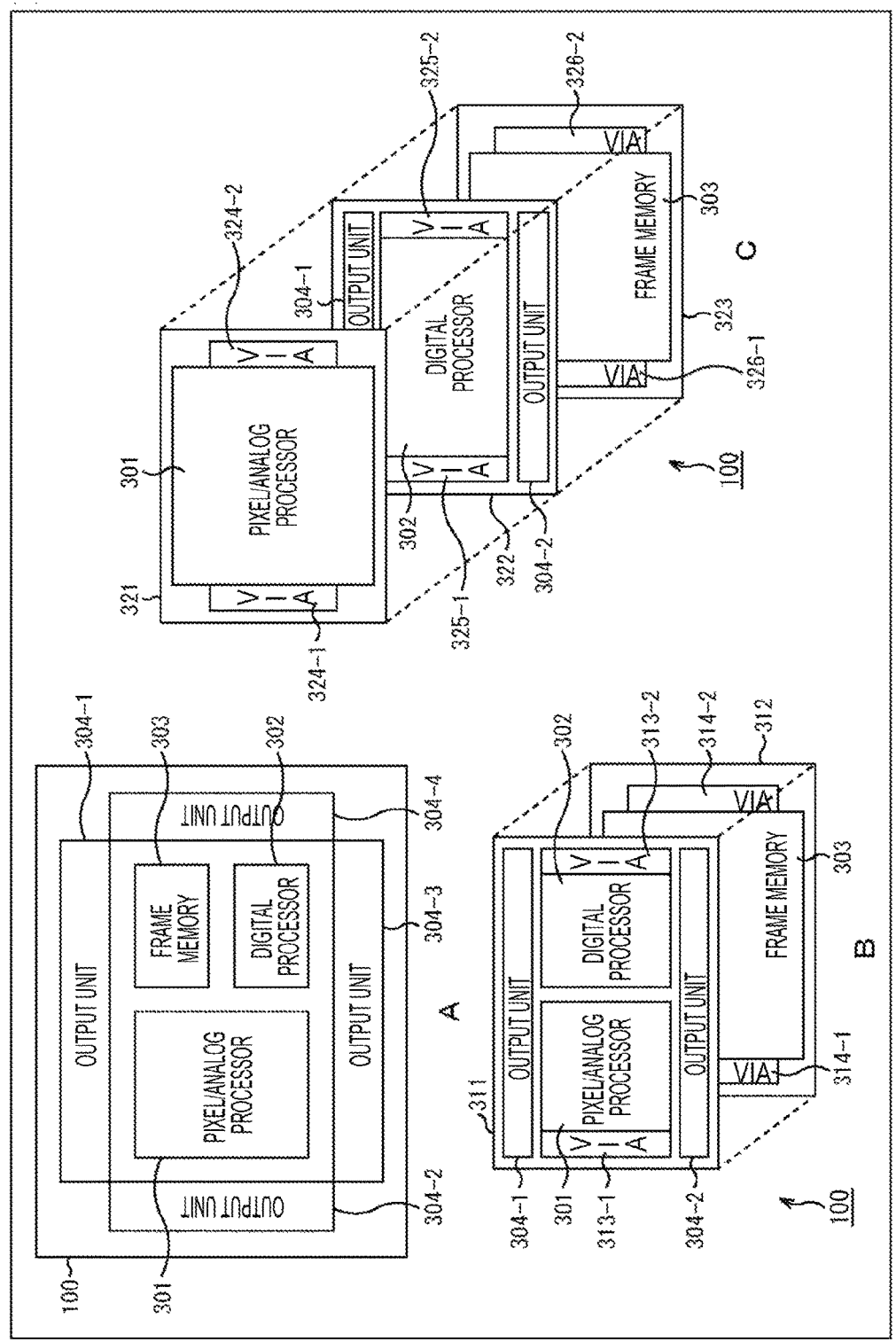
FIG. 21 is a view illustrating a physical configuration example of the image sensor.

FIG. 21 is a view illustrating an example of a physical configuration of the image sensor 100 being the image pickup element to which the present technology is applied.

In a case of the example illustrated in A of FIG. 21, an entire circuit configuration of the image sensor 100 described with reference to FIG. 1 and the like is formed on the single semiconductor device. In the case of the example in A of FIG. 21, output units 304-1 to 304-4 are arranged so as to enclose a pixel/analog processor 301, a digital processor 302, and a frame memory 303. The pixel/analog processor 301 is an area in which the pixel array 101 and an analog configuration such as the A/D converter 103 is formed. The output units 304-1 to 304-4 are areas in which a configuration such as an I/O cell is arranged, for example.

Of course, the configuration example in A of FIG. 21 is merely an example and arrangement of the configuration of each processor is not limited to this example.

In a case of the example illustrated in B of FIG. 21, the circuit configuration of the image sensor 100 described with reference to FIG. 1 and the like is formed on two semiconductor substrates superimposed on each other (stacked substrate (pixel substrate 311 and circuit substrate 312)).

The pixel/analog processor 301, the digital processor 302, and the output units 304-1 and 304-2 are formed on the pixel substrate 311. The output units 304-1 and 304-2 are areas in which the configuration such as the I/O cell is arranged, for example.

Also, the frame memory 303 is formed on the circuit substrate 312.

As described above, the pixel substrate 311 and the circuit substrate 312 are superimposed on each other to form a multi-layer structure (stacked structure). The pixel/analog processor 301 formed on the pixel substrate 311 and the frame memory 303 formed on the circuit substrate 312 are electrically connected to each other through a through via (VIA) and the like formed on a via area (VIA) 313-1 and a via area (VIA) 314-1. Similarly, the digital processor 302 formed on the pixel substrate 311 and the frame memory 303 formed on the circuit substrate 312 are electrically connected to each other through the through via (VIA) and the like formed on a via area (VIA) 313-2 and a via area (VIA) 314-2.

The present technology is also applicable to the image sensor having such stacked structure. Meanwhile, the number (number of layers) of the semiconductor substrates (stacked chip) is arbitrary; this may be three or larger as illustrated in C of FIG. 21, for example.

In a case of the example in C of FIG. 21, the image sensor 100 includes semiconductor substrates 321, 322, and 323. The semiconductor substrates 321 to 323 are superimposed on one another to form a multilayer structure (stacked structure). The pixel/analog processor 301 is formed on the semiconductor substrate 321, the digital processor 302 and the output units 304-1 and 304-2 are formed on the semiconductor substrate 322, and the frame memory 303 is formed on the semiconductor substrate 323. The processors of the respective semiconductor substrates are electrically connected to one another through the through via (VIA) formed on a via area (VIA) 324-1, a via area (VIA) 325-1, and a via area (VIA) 326-1 and the through via (VIA) formed on a via area (VIA) 324-2, a via area (VIA) 325-2, and a via area (VIA) 326-2.

The present technology is also applicable to the image sensor having such stacked structure. Of course, the processor formed on each semiconductor substrate is arbitrary and is not limited to the example in FIG. 21.

2. Second Embodiment

<Area A/D Converter>

Although it is described above that an A/D converter (column A/D converter 161) is provided for each unit pixel column in an A/D converter 103 and each column A/D converter 161 performs A/D conversion on a signal read from each unit pixel of the unit pixel column, for example, a configuration example of the A/D converter 103 is not limited thereto. For example, it is also possible that a pixel unit is formed for each predetermined number of unit pixels in a pixel array 101, an A/D converter (area A/D converter) is provided for each pixel unit in the A/D converter 103, and each area A/D converter performs the A/D conversion on the signal read from each unit pixel belonging to the pixel unit assigned to the same.

Figure 22:
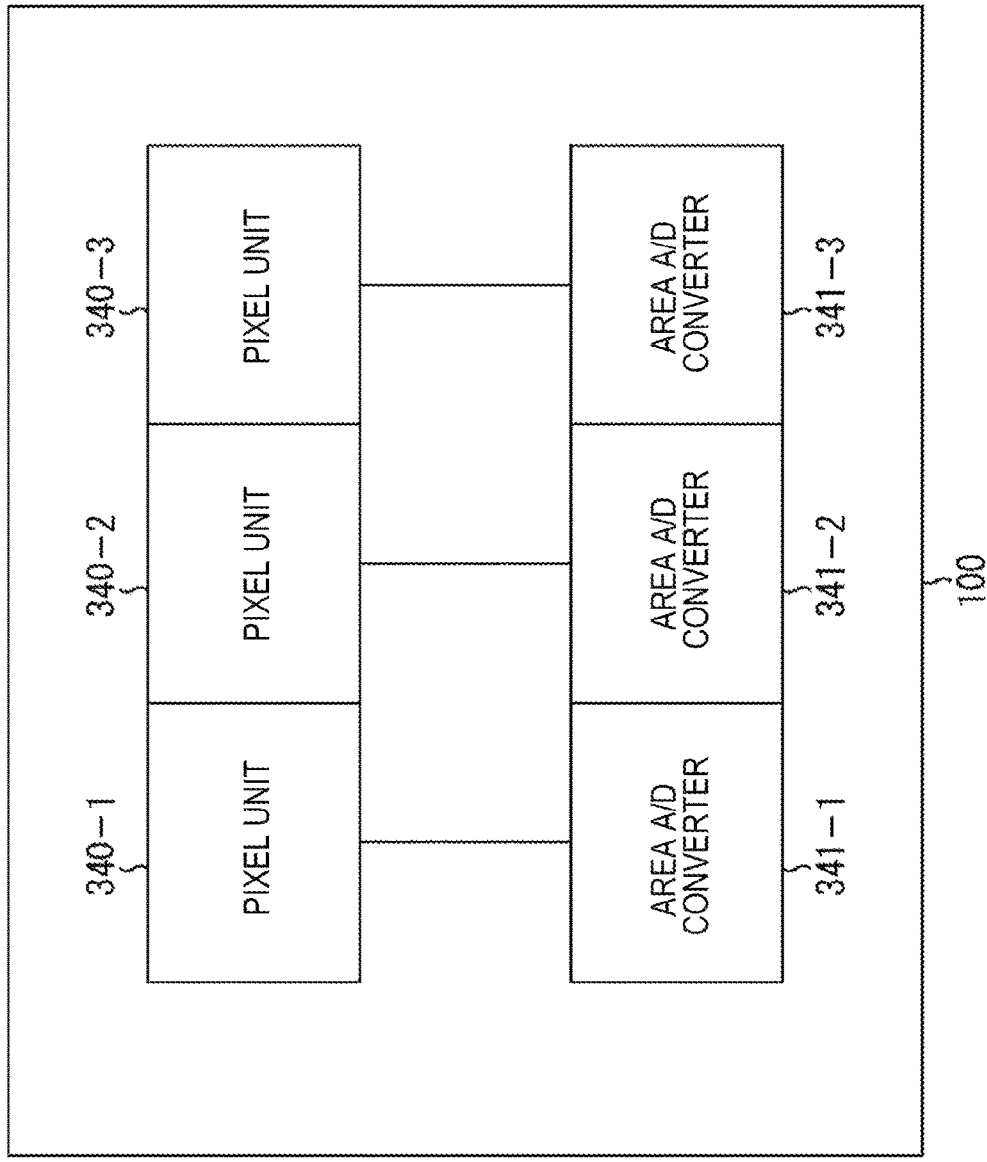
FIG. 22 is a view illustrating another configuration example of the image sensor.

In this case, for example, the pixel unit and the area A/D converter may be formed on the same semiconductor substrate as in an example illustrated in FIG. 22. In a case of the example in FIG. 22, pixel units 340-1 to 340-3 and area A/D converters 341-1 to 341-3 corresponding to them, respectively, are formed on the same semiconductor substrate. Of course, the number of the pixel units and the number of the area A/D converters are arbitrary.

When it is not hereinafter required to distinguish the pixel units formed in the pixel array 101 from one another to describe, they are referred to as the pixel units 340, and when it is not required to distinguish the area A/D converters formed on the A/D converter 103 from one another to describe, they are referred to as the area A/D converters 341.

In this case also, a configuration of an image sensor 100 may be formed on a plurality of semiconductor substrates. The image sensor 100 may include two semiconductor substrates superimposed on each other (a stacked chip (pixel substrate 351 and circuit substrate 352)) as illustrated in FIG. 23, for example.

Figure 23:
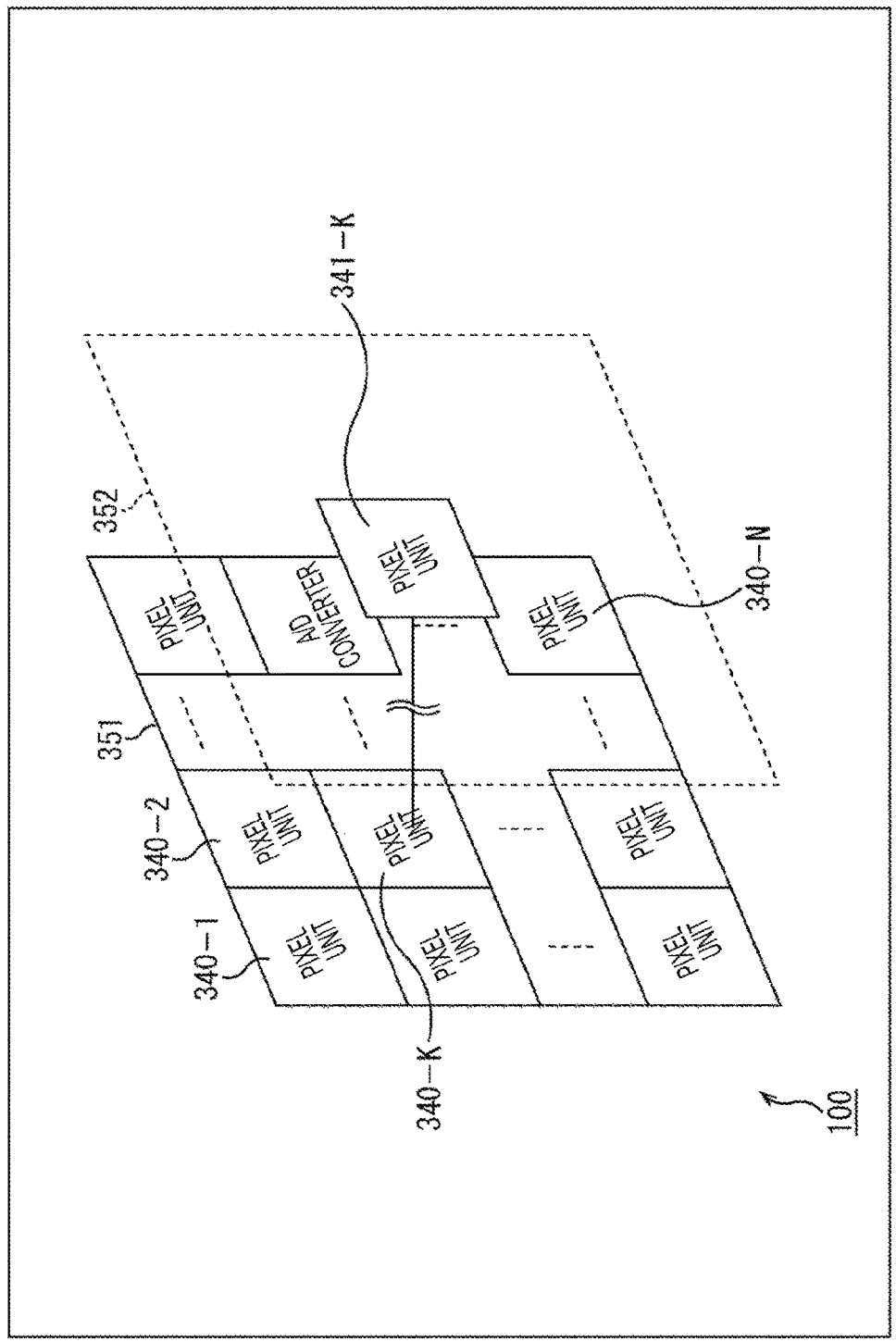
FIG. 23 is a view illustrating another configuration example of the image sensor.

In a case of an example in FIG. 23, N pixel units 340 (pixel units 340-1 to 340-N) in a pixel area (that is to say, pixel array 101) are formed on the pixel substrate 351. Also, in a position superimposed on each pixel unit 340 of the circuit substrate 352, the area A/D converter 341 corresponding to the pixel unit 340 is formed. For example, in the same position as a position of the pixel unit 340-K on the pixel substrate 351 (position superimposed on the pixel unit 340-K) of the circuit substrate 352, the area A/D converter 341-K which performs the A/D conversion on the signal read from the unit pixel of the pixel unit 340-K is formed.

Of course, the number (the number of layers) of the semiconductor substrates of the image sensor 100 is arbitrary in this case also; this may be three or larger.

<Arrangement of Counter>

In the case of such area A/D converter 341 also, an up counter 172 and a down counter 175 may be arranged in the vicinity of each other as in the case of the column A/D converter 161 of the first embodiment. That is to say, the area A/D converter 341 including the up counter 172 and the area A/D converter 341 including the down counter 175 may be arranged in the vicinity of each other. For example, the area A/D converter 341 including the up counter 172 and the area A/D converter 341 including the down counter 175 may be alternately arranged in a row direction (horizontal direction in the drawing) to form a matrix as illustrated in A of FIG. 24, A of FIG. 25, and A of FIG. 26. Also, for example, the area A/D converter 341 including the up counter 172 and the area A/D converter 341 including the down counter 175 may be alternately arranged in the row direction and in a column direction (vertical direction in the drawing) to form a matrix as illustrated in B of FIG. 24, B of FIG. 25, and B of FIG. 26.

By arranging in this manner, it is possible to arrange the up counter 172 and the down counter 175 in the vicinity of each other. Therefore, power source variation due to driving of the counter may be suppressed.

Meanwhile, the position in which the area A/D converter is arranged is not limited to that in the above-described example. For example, the position of the area A/D converter 341 including the up counter 172 and the position of the area A/D converter 341 including the down counter 175 may be exchanged in the examples in FIGS. 24 to 26. Also, the area A/D converter 341 including the up counter 172 and the area A/D converter 341 including the down counter 175 may be alternately arranged in the column direction (vertical direction in the drawing) to form a matrix. Furthermore, a plurality of area A/D converters 341 each including the up counter 172 and the area A/D converters 341 each including the down counter 175 may be alternately arranged in the row direction to form a matrix. Similarly, a plurality of area A/D converters 341 each including the up counter 172 and the area A/D converters 341 each including the down counter 175 may be alternately arranged in the row direction and in the column direction to form a matrix. Furthermore, the number of the area A/D converters 341 each including the up counter 172 and the number of the area A/D converters 341 each including the down counter 175 are not necessarily the same.

Also, it is further possible that the counter of each area A/D converter 341 is arranged in a predetermined position in an area in which the area A/D converter 341 is arranged. For example, as illustrated in FIG. 24, the area A/D converters 341 may be arranged to form a matrix, and the counter (up counter 172 or down counter 175) may be arranged on a right side or a left side in the drawing of the area in which the area A/D converter 341 itself is arranged (that is to say, in the vicinity of a right side or a left side of an outer edge of the area) in each area A/D converter 341.

Figure 24:
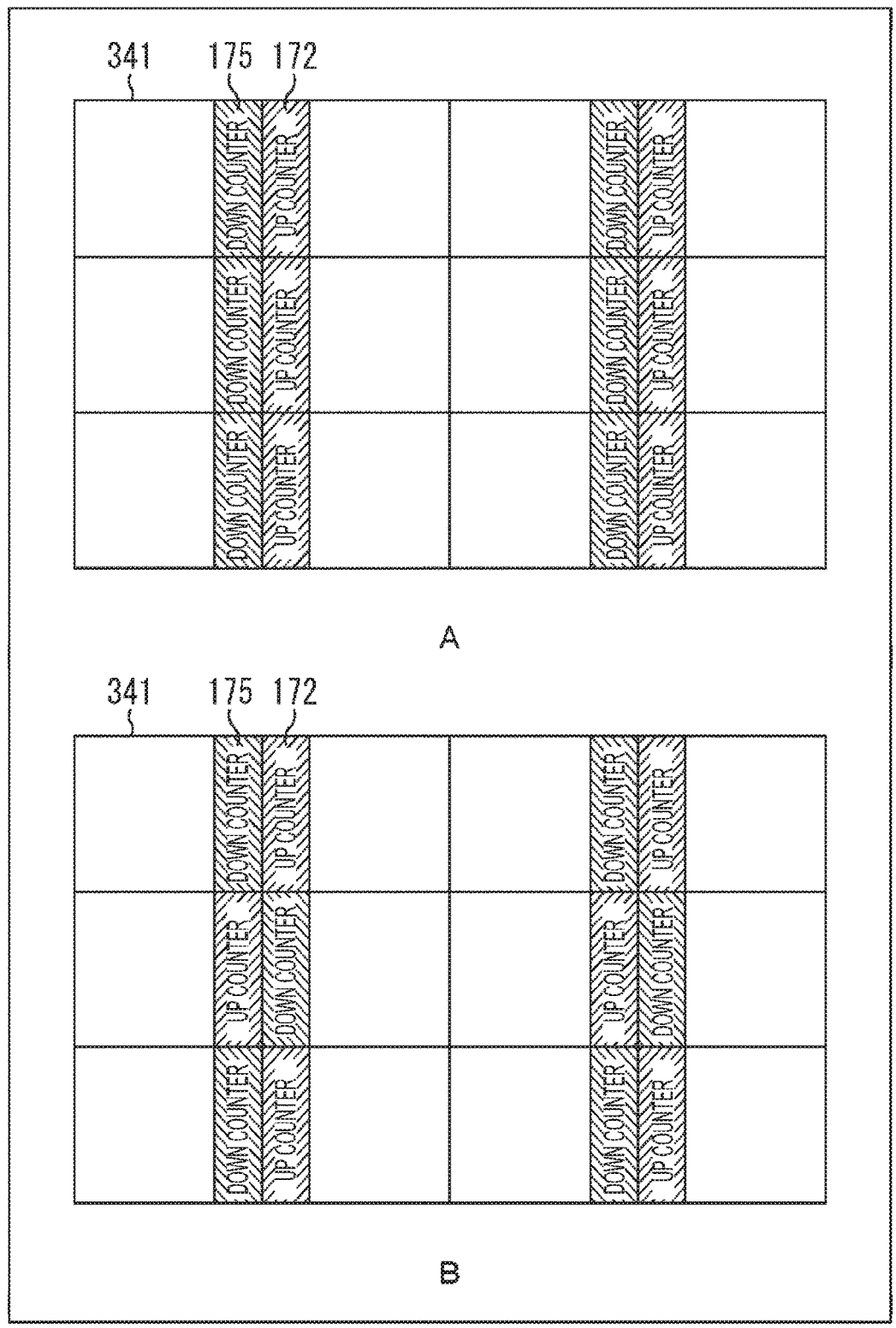
FIG. 24 is a view illustrating another arrangement example of the counter.

More specifically, in a case of the example in A of FIG. 24, the column of the area A/D converters 341 in each of which the up counter 172 is arranged on the left side of the drawing and the column of the area A/D converters 341 in each of which the down counter 175 is arranged on the right side of the drawing are alternately arranged. Also, in a case of the example in B of FIG. 24, although the position of the counter in each area A/D converter 341 is the same as that in the example in A of FIG. 24, a part of the up counters 172 and the down counters 175 are exchanged such that the area A/D converter 341 including the up counter 172 and the area A/D converter 341 including the down counter 175 are alternately arranged in the column direction and in the row direction.

Figure 25:
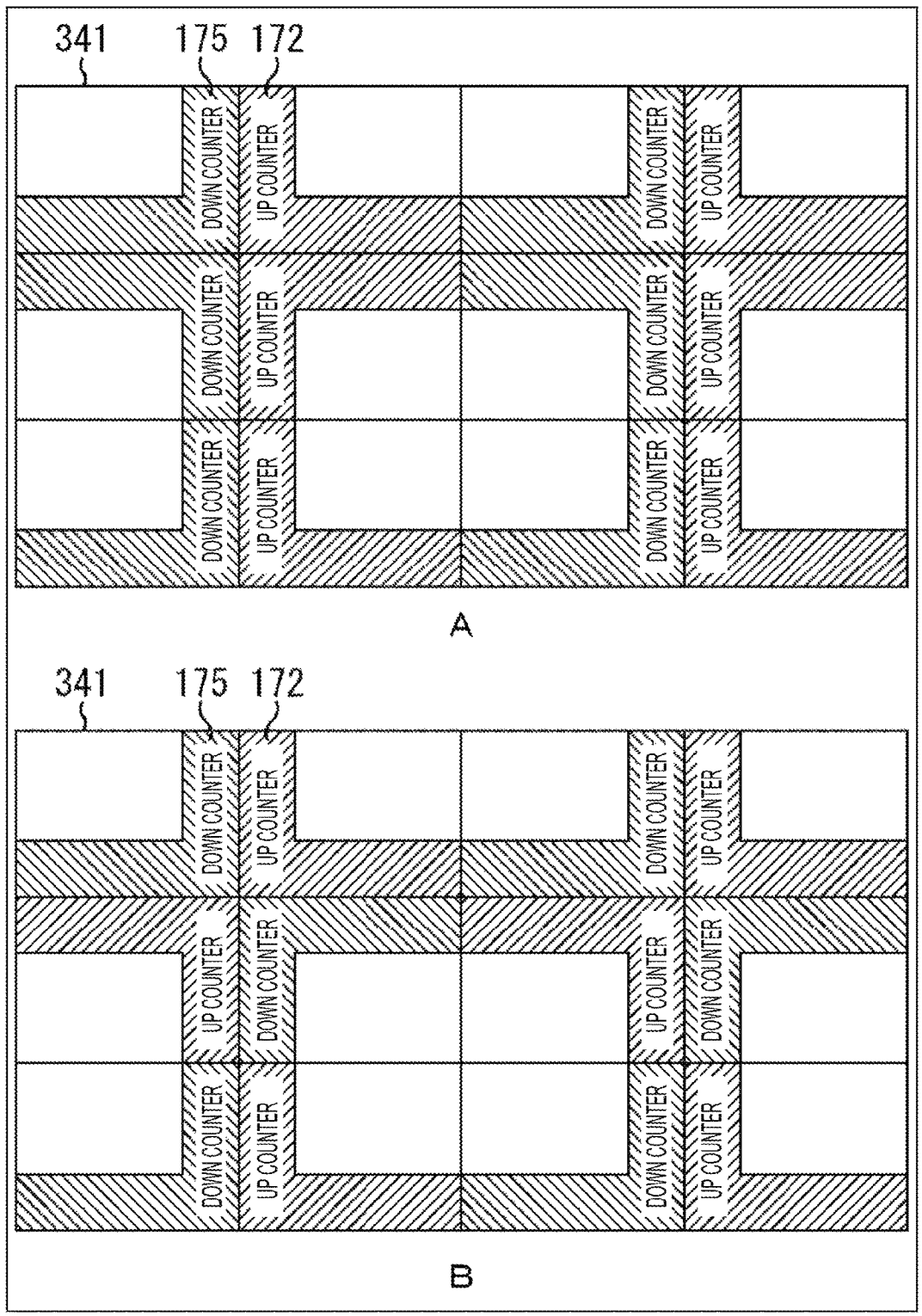
FIG. 25 is a view illustrating another arrangement example of the counter.

Also, as in the example illustrated in FIG. 25, the area A/D converters 341 may be arranged to form a matrix, and the counter (up counter 172 or down counter 175) may be arranged on the right side and a lower side in the drawing, the right side and an upper side in the drawing, the left side and the lower side in the drawing, or the left side and the upper side in the drawing of the area in which the area A/D converter 341 itself is arranged (that is to say, in the vicinity of the right side and a lower side, the right side and an upper side, the left side and the lower side, or the left side and the upper side of the outer edge of the area) in each area A/D converter 341.

More specifically, in a case of the example in A of FIG. 25, the column in which the area A/D converter 341 in which the up counter 172 is arranged on the left side and the lower side in the drawing and the area A/D converter 341 in which the up counter 172 is arranged on the left side and the upper side in the drawing are alternately arranged and the column in which the area A/D converter 341 in which the down counter 175 is arranged on the right side and the lower side in the drawing and the area A/D converter 341 in which the down counter 175 is arranged on the right side and the upper side in the drawing are alternately arranged are alternately arranged. Also, in a case of the example in B of FIG. 25, although the position of the counter of each area A/D converter 341 is the same as that in the example in A of FIG. 25, a part of the up counters 172 and the down counters 175 are exchanged, and the area A/D converter 341 including the up counter 172 and the area A/D converter 341 including the down counter 175 are alternately arranged in the column direction and in the row direction.

Figure 26:
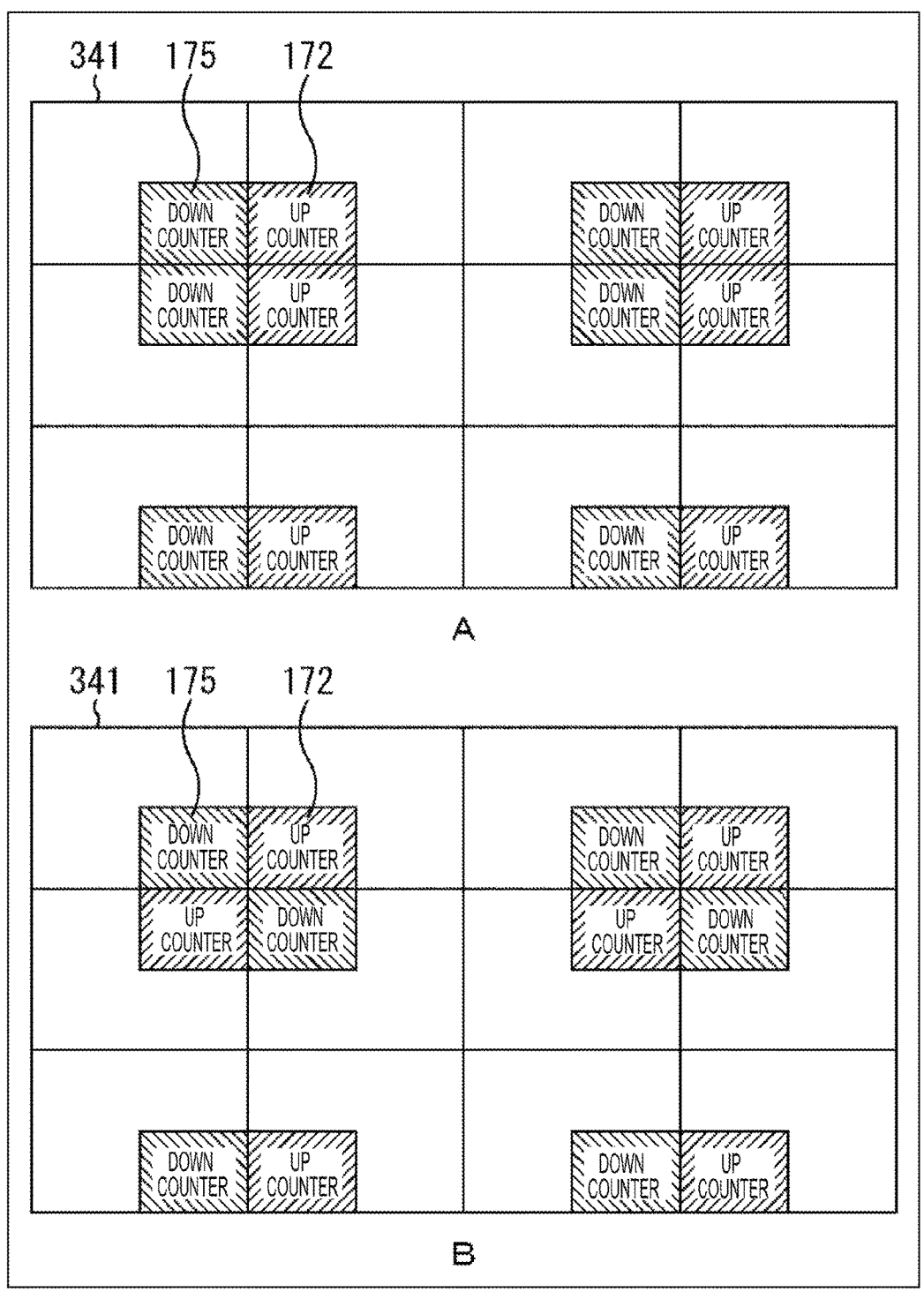
FIG. 26 is a view illustrating another arrangement example of the counter.

Also, as in the example illustrated in FIG. 26, the area A/D converters 341 may be arranged to form a matrix, and the counter (the up counter 172 or the down counter 175) may be arranged on a lower right side, an upper right side, a lower left side, or an upper left side in the drawing of the area in which the area A/D converter 341 itself is arranged (that is to say, in the vicinity of any one of four corners of the outer edge of the area) in each area A/D converter 341.

More specifically, in a case of the example in A of FIG. 26, the column in which the area A/D converter 341 in which the up counter 172 is arranged on the lower left side in the drawing and the area A/D converter 341 in which the up counter 172 is arranged on the upper left side in the drawing are alternately arranged and the column in which the area A/D converter 341 in which the down counter 175 is arranged on the lower right side in the drawing and the area A/D converter 341 in which the down counter 175 is arranged on the upper right side in the drawing are alternately arranged are alternately arranged. Also, in a case of the example in B of FIG. 26, although the position of the counter in each area A/D converter 341 is the same as that in the example in A of FIG. 26, a part of the up counters 172 and the down counters 175 are exchanged, and the area A/D converter 341 including the up counter 172 and the area A/D converter 341 including the down counter 175 are alternately arranged in the column direction and in the row direction.

By arranging the counter in a predetermined position in each area A/D converter 341 as in the examples, it is possible to arrange the up counter 172 and the down counter 175 so as to be closer to each other. Therefore, power source variation due to driving of the counter may be suppressed.

Of course, the arrangement example of the counters is arbitrary and an example other than this is also possible. For example, the position of the up counter 172 and the position of the down counter 175 may be exchanged in the examples in FIGS. 24 to 26. Also, a plurality of up counters 172 and a plurality of down counters 175 may be alternately arranged in the row direction to form a matrix. Similarly, a plurality of up counters 172 and a plurality of down counters 175 may be alternately arranged in the row direction and in the column direction to form a matrix.

Also, for example, it is possible that the up counter 172 and the down counter 175 are arranged on the upper side or the lower side in the drawing of the area in which the area A/D converter 341 is arranged. Also, for example, it is also possible that the up counter 172 and the down counter 175 are arranged in the vicinity of arbitrary three sides of the outer edge of the area in which the area A/D converter 341 is arranged. Also, for example, it is possible that the up counter 172 and the down counter 175 are arranged in the vicinity of a plurality of arbitrary corners of the outer edge of the area in which the area A/D converter 341 is arranged. Furthermore, not all the numbers of the counters included in the respective area A/D converters (certain processors which use the counter) are necessarily the same.

3. Third Embodiment

<Imaging Device>

Figure 27:
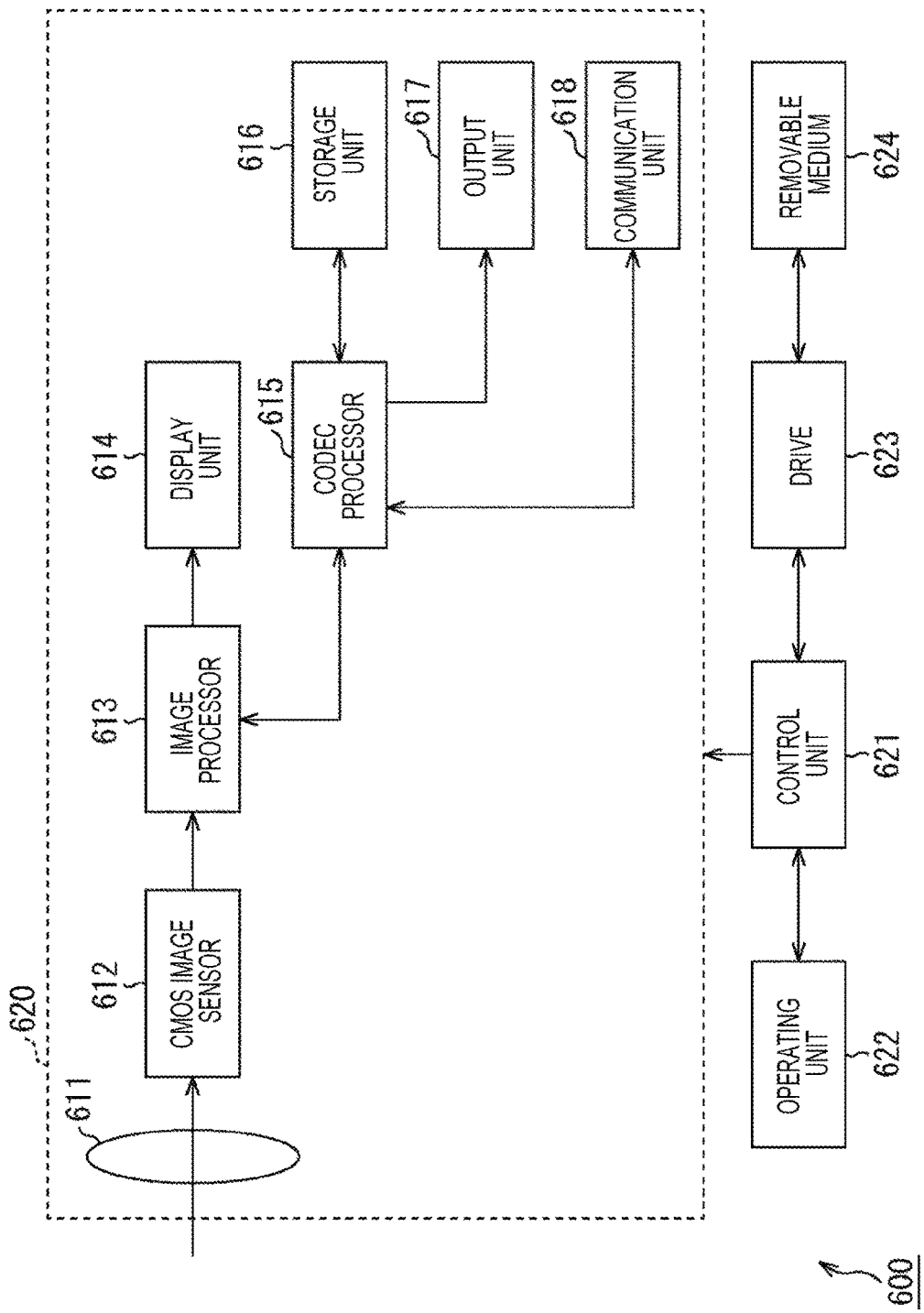
FIG. 27 is a view illustrating a principal configuration example of an imaging device.

Meanwhile, the present technology is also applicable to a device other than an image pickup element. For example, the present technology may also be applied to a device including the image pickup element (electronic device and the like) such as an imaging device. FIG. 27 is a block diagram illustrating a principal configuration example of the imaging device as an example of the electronic device to which the present technology is applied. An imaging device 600 illustrated in FIG. 27 is a device which captures an image of an object and outputs the image of the object as an electric signal.

As illustrated in FIG. 27, the imaging device 600 includes an optical unit 611, a CMOS image sensor 612, an image processor 613, a display unit 614, a codec processor 615, a storage unit 616, an output unit 617, a communication unit 618, a control unit 621, an operating unit 622, and a drive 623.

The optical unit 611 is formed of a lens which adjusts a focal point to the object and condenses light from a focal position, a diaphragm which adjusts exposure, a shutter which controls imaging timing and the like. The optical unit 611 transmits light from the object (incident light) to supply to the CMOS image sensor 612.

The CMOS image sensor 612 performs photoelectric conversion on the incident light and performs A/D conversion on a signal for each pixel (pixel signal), performs signal processing such as correlated double sampling (CDS), and supplies captured image data subjected to the processing to the image processor 613.

The image processor 613 performs image processing on the captured image data obtained by the CMOS image sensor 612. More specifically, the image processor 613 performs various pieces of image processing such as color mixture correction, black level correction, white balance adjustment, demosaic processing, matrix processing, gamma correction, and YC conversion, for example, on the captured image data supplied from the CMOS image sensor 612. The image processor 613 supplies the captured image data to which the image processing is applied to the display unit 614.

The display unit 614 formed as a liquid crystal display and the like, for example, displays an image of the captured image data (for example, the image of the object) supplied from the image processor 613.

The image processor 613 further supplies the captured image data to which the image processing is applied to the codec processor 615 as needed.

The codec processor 615 applies a coding process of a predetermined system to the captured image data supplied from the image processor 613 and supplies obtained coded data to the storage unit 616. Also, the codec processor 615 reads the coded data recorded in the storage unit 616, decodes the same to generate decoded image data, and supplies the decoded image data to the image processor 613.

The image processor 613 applies predetermined image processing to the decoded image data supplied from the codec processor 615. The image processor 613 supplies the decoded image data to which the image processing is applied to the display unit 614. The display unit 614 formed as the liquid crystal display and the like, for example, displays an image of the decoded image data supplied from the image processor 613.

Also, the codec processor 615 may supply the coded data obtained by coding the captured image data supplied from the image processor 613 or the coded data of the captured image data read from the storage unit 616 to the output unit 617 and output the same out of the imaging device 600. Also, the codec processor 615 may supply the captured image data before the coding or the decoded image data obtained by decoding the coded data read from the storage unit 616 to the output unit 617 and output the same out of the imaging device 600.

Furthermore, the codec processor 615 may also transmit the captured image data, the coded data of the captured image data or the decoded image data to another device through the communication unit 618. The codec processor 615 may also obtain the captured image data and the coded data of the image data through the communication unit 618. The codec processor 615 appropriately codes or decodes the captured image data and the coded data of the image data obtained though the communication unit 618. The codec processor 615 may also supply the obtained image data or coded data to the image processor 613 or output to the storage unit 616, the output unit 617, and the communication unit 618 as described above.

The storage unit 616 stores the coded data and the like supplied from the codec processor 615. The coded data stored in the storage unit 616 is read by the codec processor 615 to be decoded as needed. The captured image data obtained by a decoding process is supplied to the display unit 614 and a captured image corresponding to the captured image data is displayed.

The output unit 617 including an external output interface such as an external output terminal outputs various data supplied through the codec processor 615 out of the imaging device 600 through the external output interface.

The communication unit 618 supplies various pieces of information such as the image data and the coded data supplied from the codec processor 615 to another device being a communication partner of predetermined communication (wired or wireless communication). The communication unit 618 also obtains the various pieces of information such as the image data and the coded data from another device being the communication partner of predetermined communication (wired or wireless communication) and supplies the same to the codec processor 615.

The control unit 621 controls operation of each processor (each processor enclosed by dotted line 620, the operating unit 622, and the drive 623) of the imaging device 600.

The operating unit 622 formed of an arbitrary input device such as a jog dial (TM), a key, a button, or a touch panel, for example, receives an operation input by a user and the like, for example, and supplies a signal corresponding to the operation input to the control unit 621.

The drive 623 reads information stored in a removable medium 624 such as a magnetic disc, an optical disc, a magneto-optical disc, and a semiconductor memory, for example, mounted thereon. The drive 623 reads various pieces of information such as a program and data from the removable medium 624 and supplies the same to the control unit 621. Also, when a writable removable medium 624 is mounted on the drive 623, this may store various pieces of information such as the image data and the coded data, for example, supplied through the control unit 621 in the removable medium 624.

The present technology described above in each embodiment is applied as the CMOS image sensor 612 of the imaging device 600 described above. That is to say, the above-described image sensor 100 is used as the CMOS image sensor 612. According to this, the CMOS image sensor 612 may suppress power source variation due to driving of a counter of an A/D converter to inhibit an image quality of the captured image from deteriorating. Therefore, the imaging device 600 may obtain a higher-quality captured image by capturing an image of the object.

The above-described series of processes may be executed by hardware or by software. When the above-described series of processes is executed by the software, a program which forms the software is installed from a network or a recording medium.

The recording medium is formed of the removable medium 624 in which the program is recorded distributed for delivering the program to the user separately from a device main body as illustrated in FIG. 27, for example. The removable medium 624 includes the magnetic disc (including a flexible disk) and the optical disc (including a CD-ROM and a DVD). The magneto-optical disc (including a Mini Disc (MD)), the semiconductor memory and the like are further included.

In this case, the program may be installed on the storage unit 616 by mount of the removable medium 624 on the drive 623.

The program may also be provided through a wired or wireless transmission medium such as a local area network, the Internet, digital satellite broadcasting and the like. In this case, the program may be received by the communication unit 618 to be installed on the storage unit 616.

In addition, the program may also be installed in advance on the storage unit 616 and a read only memory (ROM) in the control unit 621.

Meanwhile, the program executed by a computer may be the program of which processes are performed in chronological order in the order described in this specification or may be the program of which processes are performed in parallel or at necessary timing such as when a call is issued.

Also, in this specification, a step of describing the program recorded in the recording medium includes not only the processes performed in chronological order in the described order but also the processes executed in parallel or individually which are not necessarily performed in chronological order.

Also, the process at each step described above may be executed in each device described above or any device other than the above-described device. In this case, the device which executes the process may include a function (functional block and the like) required for executing the above-described process. Also, information required for the process may be appropriately transmitted to the device.

Also, in this specification, a system is intended to mean assembly of a plurality of components (devices, modules (parts) and the like) and it does not matter whether all the components are in the same casing. Therefore, a plurality of devices accommodated in different casings connected through a network and one device obtained by accommodating a plurality of modules in one casing are the systems.

It is also possible to divide the configuration described above as one device (or processor) into a plurality of devices (or processors). Other way round, it is also possible to put the configurations described above as a plurality of devices (or processors) together as one device (or processor). Also, of course, it is possible that a configuration other than the above-described one is added to the configuration of each device (or each processor). Furthermore, it is also possible that a part of the configuration of a certain device (or processor) is included in the configuration of another device (or another processor) as long as a configuration and operation as an entire system are substantially the same.

Although preferred embodiments of the present disclosure are described above in detail with reference to the attached drawings, the technical scope of the present disclosure is not limited to such examples. It is clear that one of ordinary skill in the art of the present disclosure may conceive of various modifications or corrections within the scope of the technical idea recited in claims and it is understood that they also naturally belong to the technical scope of the present disclosure.

For example, the present technology may be configured as cloud computing in which one function is shared by a plurality of devices through a network for processing in cooperation.

Also, each step described in the above-described flowchart may be executed by one device or by a plurality of devices in a shared manner.

Furthermore, when a plurality of processes is included in one step, a plurality of processes included in one step may be executed by one device or by a plurality of devices in a shared manner.

Also, the present technology is not limited thereto and may also be performed as any configuration mounted on a device forming such device or system, for example, a processor as a system large scale integration (LSI) and the like, a module using a plurality of processors and the like, a unit using a plurality of modules and the like, and a set obtained by adding still another function to the unit (that is to say, a partial configuration of the device).

Meanwhile, the present technology may also have following configurations.

(1) A signal processing device including:
a first A/D converter which performs A/D conversion on an analog signal by using a first counter being a predetermined counter; and
a second A/D converter which performs the A/D conversion on the analog signal by using a second counter count timing of which is the same as the count timing of the first counter and a polarity of a count value of which is opposite to the polarity of the count value of the first counter, wherein the first A/D converter and the second A/D converter are arranged in the vicinity of each other such that power source variations of the first and second A/D converters affect each other.

(2) The signal processing device according to (1), wherein
the first counter is an up counter, and
the second counter is a down counter.

(3) The signal processing device according to (2), wherein
the first counter and the second counter are non-synchronous counters.

(4) The signal processing device according to (2) or (3), wherein
the first counter and the second counter are synchronous counters.

(5) The signal processing device according to any one of (2) to (4), wherein
the first counter and the second counter are formed of JK flip-flops.

(6) The signal processing device according to any one of (2) to (5), wherein
the first counter and the second counter are formed of D flip-flops.

(7) The signal processing device according to any one of (2) to (6), wherein
the first counter is obtained by driving an up/down counter as the up counter, and
the second counter is obtained by driving the up/down counter as the down counter.

(8) The signal processing device according to any one of (2) to (7), wherein
the first counter and the second counter are binary counters.

(9) The signal processing device according to any one of (2) to (8), wherein
the first counter and the second counter are gray code counters.

(10) The signal processing device according to any one of (2) to (9), wherein
the first counter and the second counter are counters which use a time to digital converter (TDC).

(11) The signal processing device according to any one of (1) to (10), wherein
each of the first A/D converter and the second A/D converter performs the A/D conversion on the analog signal by a single slope A/D conversion system.

(12) The signal processing device according to any one of (1) to (11), wherein
each of the first A/D converter and the second A/D converter performs the A/D conversion on the analog signal by an integral type A/D conversion system.

(13) The signal processing device according to any one of (1) to (12), wherein
the first A/D converter and the second A/D converter are alternately arranged in one row.

(14) The signal processing device according to any one of (1) to (13), wherein a plurality of first A/D converters and a plurality of second A/D converters are alternately arranged in one row.

(15) The signal processing device according to any one of (1) to (14), wherein
the first A/D converter and the second A/D conversion are alternately arranged in a row direction to form a matrix.

(16) The signal processing device according to any one of (1) to (15), wherein
the first A/D converter and the second A/D converter are alternately arranged in the row direction and in a column direction to form a matrix.

(17) The signal processing device according to any one of (1) to (16), wherein each of the first A/D converter and the second A/D converter performs the A/D conversion on a signal read from a unit pixel belonging to a unit pixel column assigned to each of the first A/D converter and the second A/D converter in a pixel area.

(18) The signal processing device according to any one of (1) to (17), wherein
each of the first A/D converter and the second A/D converter performs the A/D conversion on the signal read from the unit pixel in a partial area assigned to each of the first A/D converter and the second A/D converter in the pixel area.

(19) An image pickup element including:
a pixel array in which a plurality of unit pixels is arranged to form a matrix;
a first A/D converter which performs A/D conversion on an analog signal read from a unit pixel arranged in the pixel array by using a first counter being a predetermined counter; and
a second A/D converter which performs the A/D conversion on the analog signal read from the unit pixel arranged in the pixel array by using a second counter count timing of which is the same as the count timing of the first counter and a polarity of a count value of which is opposite to the polarity of the count value of the first counter, wherein
the first A/D converter and the second A/D converter are arranged in the vicinity of each other such that power source variations of the first and second A/D converters affect each other.

(20) An electronic device including:
an imaging unit which captures an image of an object; and
an image processor which performs image processing on image data obtained by imaging by the imaging unit, the imaging unit including:
a pixel array in which a plurality of unit pixels is arranged to form a matrix;
a first A/D converter which performs A/D conversion on an analog signal by using a first counter being a predetermined counter; and
a second A/D converter which performs the A/D conversion on the analog signal by using a second counter count timing of which is the same as the count timing of the first counter and a polarity of a count value of which is opposite to the polarity of the count value of the first counter, wherein
the first A/D converter and the second A/D converter are arranged in the vicinity of each other such that power source variations of the first and second A/D converters affect each other.

REFERENCE SIGNS LIST

100 Image sensor
101 Pixel array
102 Reference voltage generating unit
103 A/D converter
104 Horizontal transfer unit
111 Control unit
112 Vertical scanning unit
121 Vertical signal line
122 Reference signal line
123, 124 Signal line
125 Control line
131 to 134 Control line
141 Unit pixel
161 Column A/D converter
171 Comparing unit
172 Up counter
173, 174 Capacitor
175 Down counter
181 JK flip-flop
201 Selector
231 D flip-flop
241 Switch
242 Resistance
243 Integrating unit
244 Capacitor
245 Comparing unit
246 Up counter
247 Down counter
600 Imaging device
612 CMOS image sensor

What is claimed is:
1. A signal processing device, comprising:
a first signal line;
a first analog to digital (A/D) converter, wherein the first A/D converter performs A/D conversion on an analog signal received from the first signal line by using a first counter;
a second signal line; and
a second A/D converter, wherein the second A/D converter performs A/D conversion on an analog signal received from the second signal line by using a second counter, wherein a count timing of the second counter is the same as a count timing of the first counter, wherein a polarity of a count value of the second counter is opposite to a polarity of a count value of the first counter, and wherein the first A/D converter and the second A/D converter are arranged in a vicinity of each other such that power source variations of the first and second A/D converters affect each other.

2. The signal processing device according to claim 1, wherein
the first counter is an up counter, and wherein the second counter is a down counter.

3. The signal processing device according to claim 2, wherein
the first counter and the second counter are non-synchronous counters.

4. The signal processing device according to claim 2, wherein
the first counter and the second counter are synchronous counters.

5. The signal processing device according to claim 2, wherein
the first counter and the second counter are formed of JK flip-flops.

6. The signal processing device according to claim 2, wherein
the first counter and the second counter are formed of D flip-flops.

7. The signal processing device according to claim 2, wherein
the first counter is obtained by driving an up/down counter as the up counter, and
wherein the second counter is obtained by driving the up/down counter as the down counter.

8. The signal processing device according to claim 2, wherein
the first counter and the second counter are binary counters.

9. The signal processing device according to claim 2, wherein
the first counter and the second counter are gray code counters.

10. The signal processing device according to claim 2, wherein
the first counter and the second counter are counters which use a time to digital converter (TDC).

11. The signal processing device according to claim 1, wherein each of the first A/D converter and the second A/D converter performs the A/D conversion on the respective analog signal by a single slope A/D conversion system.

12. The signal processing device according to claim 1, wherein
each of the first A/D converter and the second A/D converter performs the A/D conversion on the respective analog signal by an integral type A/D conversion system.

13. The signal processing device according to claim 1, wherein
the first A/D converter and the second A/D converter are alternately arranged in one row.

14. The signal processing device according to claim 1, wherein
a plurality of first A/D converters and a plurality of second A/D converters are alternately arranged in one row.

15. The signal processing device according to claim 1, wherein
the first A/D converter and the second A/D converter are alternately arranged in a row direction to form a matrix.

16. The signal processing device according to claim 1, wherein
the first A/D converter and the second A/D converter are alternately arranged in a row direction and in a column direction to form a matrix.

17. The signal processing device according to claim 1, wherein the analog signal provided to the first A/D converter by the first signal line is read from a unit pixel belonging to a first unit pixel column assigned to the first A/D converter, and wherein the analog signal provided to the second A/D converter by the second signal line is read from a unit pixel belonging to a second unit pixel column assigned to the second A/D converter.

18. The signal processing device according to claim 1, wherein the analog signal provided to the first A/D converter by the first signal line is read from a unit pixel in a first partial pixel area assigned to the first A/D converter, and wherein the analog signal provided to the second A/D converter by the second signal line is read from a unit pixel in a second partial pixel area assigned to the second A/D converter.

19. An image pickup element, comprising:
a pixel array in which a plurality of unit pixels is arranged to form a matrix;
a first signal line,
a first analog to digital (A/D) converter, wherein the first A/D converter performs A/D conversion on an analog signal received from the first signal line that is read from a first unit pixel arranged in the pixel array by using a first counter;
a second signal line; and
a second A/D converter, wherein the second A/D converter performs A/D conversion on an analog signal received from the second signal line that is read from a second unit pixel arranged in the pixel array by using a second counter, wherein a count timing of the second counter is the same as a count timing of the first counter, wherein a polarity of a count value of the second counter is opposite to a polarity of a count value of the first counter, and wherein
the first A/D converter and the second A/D converter are arranged in a vicinity of each other such that power source variations of the first and second A/D converters affect each other.

20. An electronic device, comprising:
an imaging unit which captures an image of an object; and
an image processor which performs image processing on image data obtained by imaging by the imaging unit,
the imaging unit including:
a pixel array in which a plurality of unit pixels is arranged to form a matrix;
a plurality of signal lines, the plurality of signal lines including at least first and second signal lines;
a first analog to digital (A/D) converter, wherein the first AD converter performs A/D conversion on an analog signal received from the first signal line by using a first counter; and
a second A/D converter, wherein the second A/D converter performs A/D conversion on an analog signal received from the second signal line by using a second counter, wherein a count timing of the second counter is the same as a count timing of the first counter, wherein a polarity of a count value of the second counter is opposite to a polarity of the count value of the first counter, and wherein
the first A/D converter and the second A/D converter are arranged in a vicinity of each other such that power source variations of the first and second A/D converters affect each other.

* * * * *